United States Patent
Landry et al.

(10) Patent No.: US 10,396,770 B2
(45) Date of Patent: Aug. 27, 2019

(54) ACTIVE TRIAC TRIGGERING CIRCUIT

(71) Applicant: Ademco Inc., Golden Valley, MN (US)

(72) Inventors: Daniel Landry, St-Hyacinthe (CA); Daniel Tousignant, St-Jean-sur-Richelieu (CA); Alex Daher, Longueuil (CA); Marco Lussier, St-Jean-sur-Richelieu (CA)

(73) Assignee: Ademco Inc., Golden Valley, MN (US)

( * ) Notice: Subject to any disclaimer, the term of this patent is extended or adjusted under 35 U.S.C. 154(b) by 0 days.

(21) Appl. No.: 15/792,595

(22) Filed: Oct. 24, 2017

(65) Prior Publication Data

US 2018/0048300 A1 Feb. 15, 2018

Related U.S. Application Data

(63) Continuation of application No. 13/868,716, filed on Apr. 23, 2013, now Pat. No. 9,806,705.

(51) Int. Cl.
*H03K 17/00* (2006.01)
*H02M 5/257* (2006.01)
(Continued)

(52) U.S. Cl.
CPC .............. *H03K 17/00* (2013.01); *H02M 1/44* (2013.01); *H02M 5/257* (2013.01);
(Continued)

(58) Field of Classification Search
None
See application file for complete search history.

(56) References Cited

U.S. PATENT DOCUMENTS 3,464,673 A 9/1969 Cargo et al.
3,665,159 A 5/1972 Becker et al.
(Continued)

FOREIGN PATENT DOCUMENTS

CA 1035448 A 7/1978
DE 3334117 A1 4/1985
(Continued)

OTHER PUBLICATIONS

Climatouch, User Manual, Climatouch CT03TSB Thermostat, Climatouch CT03TSHB Thermostat with Humidity Control, Outdoor UHF Temperature Transmitter 217S31, 19 pages, Printed Sep. 15, 2004.
(Continued)

*Primary Examiner* — Jared Fureman
*Assistant Examiner* — James P Evans
(74) *Attorney, Agent, or Firm* — Shumaker & Sieffert, P.A.

(57) ABSTRACT

A power supply unit for use with thermostats or other like devices requiring power. A power supply unit may be designed to keep electromagnetic interference emissions at a minimum, particularly at a level that does not violate governmental regulations. A unit may be designed so that there is enough power for a triggering a switch at about a cross over point of a waveform of input power to the unit. Power for triggering may come from a storage source rather than line power to reduce emissions on the power line. Power for the storage source may be provided with power stealing. Power stealing may require switching transistors which can generate emissions. Gate signals to the transistors may be especially shaped to keep emissions from transistor switching at a minimum.

20 Claims, 21 Drawing Sheets

(51) Int. Cl.
*H02M 1/44* (2007.01)
*H03K 17/13* (2006.01)
*H03K 17/725* (2006.01)
*H02M 1/00* (2006.01)

(52) U.S. Cl.
CPC ......... *H03K 17/136* (2013.01); *H03K 17/725* (2013.01); *H02M 2001/0006* (2013.01); *H03K 2217/0081* (2013.01); *Y10T 307/615* (2015.04)

(56) References Cited

U.S. PATENT DOCUMENTS

| | | |
|---|---|---|
| 3,899,713 A | 8/1975 | Barkan et al. |
| 3,942,028 A | 3/1976 | Baker |
| 4,078,720 A | 3/1978 | Nurnberg |
| 4,079,366 A | 3/1978 | Wong |
| 4,093,943 A | 6/1978 | Knight |
| 4,151,387 A | 4/1979 | Peters, Jr. |
| 4,174,807 A | 11/1979 | Smith et al. |
| 4,197,571 A | 4/1980 | Grunert |
| 4,224,615 A | 9/1980 | Penz |
| 4,232,819 A | 11/1980 | Bost |
| 4,257,555 A | 3/1981 | Neel |
| 4,264,034 A | 4/1981 | Hyltin et al. |
| 4,274,045 A | 6/1981 | Goldstein |
| 4,296,334 A | 10/1981 | Wong |
| 4,298,946 A | 11/1981 | Hartsell et al. |
| 4,300,199 A | 11/1981 | Yoknis et al. |
| 4,308,991 A | 1/1982 | Peinetti et al. |
| 4,316,256 A | 2/1982 | Hendricks et al. |
| 4,332,352 A | 6/1982 | Jaeger |
| 4,337,822 A | 7/1982 | Hyltin et al. |
| 4,337,893 A | 7/1982 | Flanders et al. |
| 4,373,664 A | 2/1983 | Barker et al. |
| 4,379,483 A | 4/1983 | Farley |
| 4,382,544 A | 5/1983 | Stewart |
| 4,384,213 A | 5/1983 | Bogel |
| 4,386,649 A | 6/1983 | Hines et al. |
| 4,388,692 A | 6/1983 | Jones et al. |
| 4,431,134 A | 2/1984 | Hendricks et al. |
| 4,446,913 A | 5/1984 | Krocker |
| 4,479,604 A | 10/1984 | Didner |
| 4,503,471 A | 3/1985 | Hanajima et al. |
| 4,504,778 A | 3/1985 | Evans |
| 4,506,827 A | 3/1985 | Jamieson et al. |
| 4,556,169 A | 12/1985 | Zervos |
| 4,585,164 A | 4/1986 | Butkovich et al. |
| 4,606,401 A | 8/1986 | Levine et al. |
| 4,621,336 A | 11/1986 | Brown |
| 4,622,544 A | 11/1986 | Bially et al. |
| 4,628,201 A | 12/1986 | Schmitt |
| 4,641,013 A | 2/1987 | Dunnigan et al. |
| 4,646,964 A | 3/1987 | Parker et al. |
| 4,692,596 A | 9/1987 | Payne |
| 4,706,177 A | 11/1987 | Josephson |
| 4,717,333 A | 1/1988 | Carignan |
| 4,725,001 A | 2/1988 | Carney et al. |
| 4,745,300 A | 5/1988 | Kammerer et al. |
| 4,745,311 A | 5/1988 | Iwasaki |
| 4,806,843 A | 2/1989 | Mertens et al. |
| 4,811,163 A | 3/1989 | Fletcher |
| 4,829,779 A | 5/1989 | Munson et al. |
| 4,837,731 A | 6/1989 | Levine et al. |
| 4,881,686 A | 11/1989 | Mehta |
| 4,918,439 A | 4/1990 | Wozniak et al. |
| 4,939,995 A | 7/1990 | Feinberg |
| 4,942,613 A | 7/1990 | Lynch |
| 4,948,040 A | 8/1990 | Kobayashi et al. |
| 4,969,508 A | 11/1990 | Tate et al. |
| 4,992,779 A | 2/1991 | Sugino et al. |
| 4,997,029 A | 3/1991 | Otsuka et al. |
| 5,005,365 A | 4/1991 | Lynch |
| 5,012,973 A | 5/1991 | Dick et al. |
| 5,024,265 A | 6/1991 | Buchholz et al. |
| 5,025,134 A | 6/1991 | Bensoussan et al. |
| 5,036,698 A | 8/1991 | Conti |
| 5,038,851 A | 8/1991 | Mehta |
| 5,053,752 A | 10/1991 | Epstein et al. |
| 5,065,813 A | 11/1991 | Berkeley et al. |
| 5,081,411 A | 1/1992 | Walker |
| 5,086,385 A | 2/1992 | Launey et al. |
| 5,088,645 A | 2/1992 | Bell |
| 5,118,963 A | 6/1992 | Gesin |
| 5,120,983 A | 6/1992 | Samann |
| 5,140,310 A | 8/1992 | DeLuca et al. |
| 5,161,606 A | 11/1992 | Berkeley et al. |
| 5,170,935 A | 12/1992 | Federspiel et al. |
| 5,172,565 A | 12/1992 | Wruck et al. |
| 5,181,653 A | 1/1993 | Foster et al. |
| 5,187,797 A | 2/1993 | Nielsen et al. |
| 5,192,874 A * | 3/1993 | Adams ................ F23N 5/203 307/125 |
| 5,210,685 A | 5/1993 | Rosa |
| 5,221,877 A | 6/1993 | Falk |
| 5,226,591 A | 7/1993 | Ratz |
| 5,230,482 A | 7/1993 | Ratz et al. |
| 5,238,184 A | 8/1993 | Adams |
| 5,251,813 A | 10/1993 | Kniepkamp |
| 5,259,445 A | 11/1993 | Pratt et al. |
| 5,272,477 A | 12/1993 | Tashima et al. |
| 5,277,244 A | 1/1994 | Mehta |
| 5,289,047 A | 2/1994 | Broghammer |
| 5,294,849 A | 3/1994 | Potter |
| 5,317,670 A | 5/1994 | Elia |
| 5,329,991 A | 7/1994 | Mehta et al. |
| 5,348,078 A | 9/1994 | Dushane et al. |
| 5,351,035 A | 9/1994 | Chrisco |
| 5,361,009 A | 11/1994 | Lu |
| 5,386,577 A | 1/1995 | Zenda |
| 5,390,206 A | 2/1995 | Rein et al. |
| 5,404,934 A | 4/1995 | Carlson et al. |
| 5,414,618 A | 5/1995 | Mock et al. |
| 5,429,649 A | 7/1995 | Robin |
| 5,439,441 A | 8/1995 | Grimsley et al. |
| 5,452,197 A | 9/1995 | Rice |
| 5,482,209 A | 1/1996 | Cochran et al. |
| 5,495,887 A | 3/1996 | Kathnelson et al. |
| 5,502,618 A | 3/1996 | Chiou |
| 5,506,572 A | 4/1996 | Hills et al. |
| 5,526,422 A | 6/1996 | Keen |
| 5,537,106 A | 7/1996 | Mitsuhashi |
| 5,544,036 A | 8/1996 | Brown, Jr. et al. |
| 5,566,879 A | 10/1996 | Longtin |
| 5,570,837 A | 11/1996 | Brown et al. |
| 5,579,197 A | 11/1996 | Mengelt et al. |
| 5,590,831 A | 1/1997 | Manson et al. |
| 5,603,451 A | 2/1997 | Helander et al. |
| 5,654,813 A | 8/1997 | Whitworth |
| 5,668,535 A | 9/1997 | Hendrix et al. |
| 5,671,083 A | 9/1997 | Connor et al. |
| 5,673,850 A | 10/1997 | Uptegraph |
| 5,679,137 A | 10/1997 | Erdman et al. |
| 5,682,206 A | 10/1997 | Wehmeyer et al. |
| 5,711,785 A | 1/1998 | Maxwell |
| 5,732,691 A | 3/1998 | Maiello et al. |
| 5,736,795 A | 4/1998 | Zuehlke et al. |
| 5,761,083 A | 6/1998 | Brown, Jr. et al. |
| 5,782,296 A | 7/1998 | Mehta |
| 5,801,940 A | 9/1998 | Russ et al. |
| 5,810,908 A | 9/1998 | Gray et al. |
| 5,818,428 A | 10/1998 | Eisenbrandt et al. |
| 5,833,134 A | 11/1998 | Ho et al. |
| 5,839,654 A | 11/1998 | Weber |
| 5,840,094 A | 11/1998 | Osendorf et al. |
| 5,862,737 A | 1/1999 | Chin et al. |
| 5,873,519 A | 2/1999 | Beilfuss |
| 5,886,697 A | 3/1999 | Naughton et al. |
| 5,899,866 A | 5/1999 | Cyrus et al. |
| 5,902,183 A | 5/1999 | D'Souza |
| 5,903,139 A | 5/1999 | Kompelien |
| 5,909,429 A | 6/1999 | Satyanarayana et al. |
| 5,915,473 A | 6/1999 | Ganesh et al. |
| 5,917,141 A | 6/1999 | Naquin, Jr. |
| 5,917,416 A | 6/1999 | Read |

(56) References Cited

U.S. PATENT DOCUMENTS

| | | |
|---|---|---|
| D413,328 S | 8/1999 | Kazama |
| 5,937,942 A | 8/1999 | Bias et al. |
| 5,947,372 A | 9/1999 | Tiernan |
| 5,950,709 A | 9/1999 | Krueger et al. |
| 6,009,355 A | 12/1999 | Obradovich et al. |
| 6,013,121 A | 1/2000 | Chin et al. |
| 6,018,700 A | 1/2000 | Edel |
| 6,020,881 A | 2/2000 | Naughton et al. |
| 6,032,867 A | 3/2000 | Dushane et al. |
| D422,594 S | 4/2000 | Henderson et al. |
| 6,059,195 A | 5/2000 | Adams et al. |
| 6,081,197 A | 6/2000 | Garrick et al. |
| 6,084,523 A | 7/2000 | Gelnovatch et al. |
| 6,089,221 A | 7/2000 | Mano et al. |
| 6,101,824 A | 8/2000 | Meyer et al. |
| 6,104,963 A | 8/2000 | Cebasek et al. |
| 6,119,125 A | 9/2000 | Gloudeman et al. |
| 6,121,875 A | 9/2000 | Hamm et al. |
| 6,140,987 A | 10/2000 | Stein et al. |
| 6,141,595 A | 10/2000 | Gloudeman et al. |
| 6,145,751 A | 11/2000 | Ahmed |
| 6,149,065 A | 11/2000 | White et al. |
| 6,152,375 A | 11/2000 | Robison |
| 6,154,081 A | 11/2000 | Pakkala et al. |
| 6,167,316 A | 12/2000 | Gloudeman et al. |
| 6,190,442 B1 | 2/2001 | Redner |
| 6,192,282 B1 | 2/2001 | Smith et al. |
| 6,196,467 B1 | 3/2001 | Dushane et al. |
| 6,205,041 B1 | 3/2001 | Baker |
| 6,208,331 B1 | 3/2001 | Singh et al. |
| 6,216,956 B1 | 4/2001 | Ehlers et al. |
| 6,236,326 B1 | 5/2001 | Murphy |
| 6,259,074 B1 | 7/2001 | Brunner et al. |
| 6,260,765 B1 | 7/2001 | Natale et al. |
| 6,285,912 B1 | 9/2001 | Ellison et al. |
| 6,288,458 B1 | 9/2001 | Berndt |
| 6,290,140 B1 | 9/2001 | Pesko et al. |
| D448,757 S | 10/2001 | Okubo |
| 6,315,211 B1 | 11/2001 | Sartain et al. |
| 6,318,639 B1 | 11/2001 | Toth |
| 6,321,637 B1 | 11/2001 | Shanks et al. |
| 6,330,806 B1 | 12/2001 | Beaverson et al. |
| 6,344,861 B1 | 2/2002 | Naughton et al. |
| 6,351,693 B1 | 2/2002 | Monie et al. |
| 6,356,038 B2 | 3/2002 | Bishel |
| 6,385,510 B1 | 5/2002 | Hoog et al. |
| 6,394,359 B1 | 5/2002 | Morgan |
| 6,397,612 B1 | 6/2002 | Kernkamp et al. |
| 6,398,118 B1 | 6/2002 | Rosen et al. |
| 6,448,896 B1 | 9/2002 | Bankus et al. |
| 6,449,726 B1 | 9/2002 | Smith |
| 6,453,687 B2 | 9/2002 | Sharood et al. |
| D464,948 S | 10/2002 | Vasquez et al. |
| 6,460,774 B2 | 10/2002 | Sumida et al. |
| 6,466,132 B1 | 10/2002 | Caronna et al. |
| 6,478,233 B1 | 11/2002 | Shah |
| 6,490,174 B1 | 12/2002 | Kompelien |
| 6,502,758 B2 | 1/2003 | Cottrell |
| 6,507,282 B1 | 1/2003 | Sherwood |
| 6,512,209 B1 | 1/2003 | Yano |
| 6,518,953 B1 | 2/2003 | Armstrong |
| 6,518,957 B1 | 2/2003 | Lehtinen et al. |
| 6,546,419 B1 | 4/2003 | Humpleman et al. |
| 6,556,899 B1 | 4/2003 | Harvey et al. |
| 6,566,768 B2 | 5/2003 | Zimmerman et al. |
| 6,574,537 B2 | 6/2003 | Kipersztok et al. |
| 6,578,770 B1 | 6/2003 | Rosen |
| 6,580,950 B1 | 6/2003 | Johnson et al. |
| 6,581,846 B1 | 6/2003 | Rosen |
| 6,587,739 B1 | 7/2003 | Abrams et al. |
| 6,595,430 B1 | 7/2003 | Shah |
| 6,596,059 B1 | 7/2003 | Greist et al. |
| D478,051 S | 8/2003 | Sagawa |
| 6,608,560 B2 | 8/2003 | Abrams |
| 6,619,055 B1 | 9/2003 | Addy |
| 6,619,555 B2 | 9/2003 | Rosen |
| 6,621,507 B1 | 9/2003 | Shah |
| 6,622,925 B2 | 9/2003 | Carner et al. |
| 6,635,054 B2 | 10/2003 | Fjield et al. |
| 6,657,418 B2 * | 12/2003 | Atherton ............... H02M 5/293 307/39 |
| 6,663,010 B2 | 12/2003 | Chene et al. |
| 6,671,533 B2 | 12/2003 | Chen et al. |
| 6,685,098 B2 | 2/2004 | Okano et al. |
| 6,702,811 B2 | 3/2004 | Stewart et al. |
| 6,726,112 B1 | 4/2004 | Ho |
| D492,282 S | 6/2004 | Lachello et al. |
| 6,771,996 B2 | 8/2004 | Bowe et al. |
| 6,783,079 B2 | 8/2004 | Carey et al. |
| 6,786,421 B2 | 9/2004 | Rosen |
| 6,789,739 B2 | 9/2004 | Rosen |
| 6,801,849 B2 | 10/2004 | Szukala et al. |
| 6,807,041 B2 | 10/2004 | Geiger et al. |
| 6,808,524 B2 | 10/2004 | Lopath et al. |
| 6,810,307 B1 | 10/2004 | Addy |
| 6,810,397 B1 | 10/2004 | Qian et al. |
| 6,824,069 B2 | 11/2004 | Rosen |
| 6,833,990 B2 | 12/2004 | LaCroix et al. |
| 6,842,721 B2 | 1/2005 | Kim et al. |
| 6,851,621 B1 | 2/2005 | Wacker et al. |
| 6,868,293 B1 | 3/2005 | Schurr et al. |
| 6,893,438 B2 | 5/2005 | Hall et al. |
| 6,934,862 B2 | 8/2005 | Sharood et al. |
| D512,208 S | 12/2005 | Kubo et al. |
| 6,973,410 B2 | 12/2005 | Seigel |
| 7,001,495 B2 | 2/2006 | Essalik et al. |
| 7,013,845 B1 | 3/2006 | McFarland et al. |
| D520,989 S | 5/2006 | Miller |
| 7,050,026 B1 | 5/2006 | Rosen |
| 7,055,759 B2 | 6/2006 | Wacker et al. |
| 7,080,358 B2 | 7/2006 | Kuzmin |
| 7,083,109 B2 | 8/2006 | Pouchak |
| 7,083,189 B2 | 8/2006 | Ogata |
| 7,084,774 B2 | 8/2006 | Martinez |
| 7,089,088 B2 | 8/2006 | Terry et al. |
| 7,108,194 B1 | 9/2006 | Hankins, II |
| 7,119,431 B1 | 10/2006 | Hopper et al. |
| 7,130,719 B2 | 10/2006 | Ehlers et al. |
| D531,588 S | 11/2006 | Peh |
| 7,133,748 B2 | 11/2006 | Robinson |
| D533,515 S | 12/2006 | Klein et al. |
| 7,146,253 B2 | 12/2006 | Hoog et al. |
| 7,152,806 B1 | 12/2006 | Rosen |
| 7,156,318 B1 | 1/2007 | Rosen |
| 7,163,156 B2 | 1/2007 | Kates |
| 7,188,002 B2 | 3/2007 | Chapman, Jr. et al. |
| D542,236 S | 5/2007 | Klein et al. |
| 7,212,887 B2 | 5/2007 | Shah et al. |
| 7,222,800 B2 | 5/2007 | Wruck et al. |
| 7,225,054 B2 | 5/2007 | Amundson et al. |
| 7,231,605 B1 | 6/2007 | Ramakasavan |
| 7,232,075 B1 | 6/2007 | Rosen |
| 7,240,289 B2 | 7/2007 | Naughton et al. |
| 7,244,294 B2 | 7/2007 | Kates |
| 7,261,762 B2 | 8/2007 | Kang et al. |
| 7,263,283 B2 | 8/2007 | Knepler |
| 7,274,973 B2 | 9/2007 | Nichols et al. |
| 7,302,642 B2 | 11/2007 | Smith et al. |
| 7,331,187 B2 | 2/2008 | Kates |
| 7,331,426 B2 | 2/2008 | Jahkonen |
| 7,341,201 B2 | 3/2008 | Stanimirovic |
| 7,354,005 B2 | 4/2008 | Carey et al. |
| RE40,437 E | 7/2008 | Rosen |
| 7,419,532 B2 | 9/2008 | Sellers et al. |
| 7,435,278 B2 | 10/2008 | Terlson |
| 7,451,606 B2 | 11/2008 | Harrod |
| 7,452,396 B2 | 11/2008 | Terlson et al. |
| 7,476,988 B2 | 1/2009 | Mulhouse et al. |
| 7,489,094 B2 | 2/2009 | Steiner et al. |
| 7,496,627 B2 | 2/2009 | Moorer et al. |
| 7,500,026 B2 | 3/2009 | Fukanaga et al. |
| 7,505,914 B2 | 3/2009 | McCall |
| 7,542,867 B2 | 6/2009 | Steger et al. |
| 7,556,207 B2 | 7/2009 | Mueller et al. |

(56) References Cited

U.S. PATENT DOCUMENTS

| | | |
|---|---|---|
| 7,574,283 B2 | 8/2009 | Wang et al. |
| 7,584,897 B2 | 9/2009 | Schultz et al. |
| 7,594,960 B2 | 9/2009 | Johansson |
| 7,595,613 B2 | 9/2009 | Thompson et al. |
| 7,600,694 B2 | 10/2009 | Helt et al. |
| 7,604,046 B2 | 10/2009 | Bergman et al. |
| 7,617,691 B2 | 11/2009 | Street et al. |
| 7,636,615 B2 | 12/2009 | Pfingsten et al. |
| 7,642,674 B2 | 1/2010 | Mulhouse et al. |
| 7,644,591 B2 | 1/2010 | Singh et al. |
| 7,665,019 B2 | 2/2010 | Jaeger |
| 7,676,282 B2 | 3/2010 | Bosley |
| 7,692,559 B2 | 4/2010 | Face et al. |
| 7,707,189 B2 | 4/2010 | Haselden et al. |
| 7,713,339 B2 | 5/2010 | Johansson |
| 7,739,282 B1 | 6/2010 | Smith et al. |
| 7,755,220 B2 | 7/2010 | Sorg et al. |
| 7,770,242 B2 | 8/2010 | Sell |
| 7,786,620 B2 | 8/2010 | Vuk et al. |
| 7,793,056 B2 | 9/2010 | Boggs et al. |
| 7,814,516 B2 | 10/2010 | Stecyk et al. |
| 7,837,676 B2 | 11/2010 | Sinelnikov et al. |
| 7,838,803 B1 | 11/2010 | Rosen |
| 7,852,645 B2 | 12/2010 | Fouquet et al. |
| 7,859,815 B2 | 12/2010 | Black et al. |
| 7,865,252 B2 | 1/2011 | Clayton |
| 7,904,608 B2 | 3/2011 | Price |
| 7,941,431 B2 | 5/2011 | Bluhm et al. |
| 7,952,485 B2 | 5/2011 | Schecter et al. |
| 7,956,719 B2 | 6/2011 | Anderson, Jr. et al. |
| 7,957,775 B2 | 6/2011 | Allen, Jr. et al. |
| 7,984,220 B2 | 7/2011 | Gerard et al. |
| 7,992,764 B2 | 8/2011 | Magnusson |
| 7,992,794 B2 | 8/2011 | Leen et al. |
| 8,032,254 B2 | 10/2011 | Amundson et al. |
| 8,060,470 B2 | 11/2011 | Davidson et al. |
| 8,087,593 B2 | 1/2012 | Leen |
| 8,091,796 B2 | 1/2012 | Amundson et al. |
| 8,110,945 B2 | 2/2012 | Simard et al. |
| 8,136,738 B1 | 3/2012 | Kopp |
| 8,138,634 B2 | 3/2012 | Ewing et al. |
| 8,167,216 B2 | 5/2012 | Schultz et al. |
| 8,183,818 B2 | 5/2012 | Elhalis |
| 8,216,216 B2 | 7/2012 | Warnking et al. |
| 8,219,249 B2 | 7/2012 | Harrod et al. |
| 8,239,066 B2 | 8/2012 | Jennings et al. |
| 8,269,376 B1 | 9/2012 | Elberbaum |
| 8,276,829 B2 | 10/2012 | Stoner et al. |
| 8,280,556 B2 | 10/2012 | Besore et al. |
| 8,314,517 B2 | 11/2012 | Simard et al. |
| 8,346,396 B2 | 1/2013 | Amundson et al. |
| 8,410,634 B2 | 4/2013 | Park |
| 8,417,091 B2 | 4/2013 | Kim et al. |
| 8,437,878 B2 | 5/2013 | Grohman et al. |
| 8,441,155 B2 * | 5/2013 | Simard ............... G04C 23/347 307/140 |
| 8,511,577 B2 | 8/2013 | Warren et al. |
| 8,523,083 B2 | 9/2013 | Warren et al. |
| 8,532,190 B2 | 9/2013 | Shimizu et al. |
| 8,554,374 B2 | 10/2013 | Lunacek et al. |
| 8,574,343 B2 | 11/2013 | Bisson et al. |
| 8,604,746 B2 | 12/2013 | Lee |
| 8,613,792 B2 | 12/2013 | Ragland et al. |
| 8,621,881 B2 | 1/2014 | Votaw et al. |
| 8,623,117 B2 | 1/2014 | Zavodny et al. |
| 8,629,661 B2 | 1/2014 | Shimada et al. |
| 8,680,442 B2 | 3/2014 | Reusche et al. |
| 8,704,672 B2 | 4/2014 | Hoglund et al. |
| 8,729,875 B2 | 5/2014 | Vanderzon |
| 8,731,723 B2 | 5/2014 | Boll et al. |
| 8,734,565 B2 | 5/2014 | Hoglund et al. |
| 8,752,771 B2 | 6/2014 | Warren et al. |
| 8,768,341 B2 | 7/2014 | Coutelou et al. |
| 8,881,172 B2 | 11/2014 | Schneider |
| 8,886,179 B2 | 11/2014 | Pathuri et al. |
| 8,886,314 B2 | 11/2014 | Crutchfield et al. |
| 8,892,223 B2 | 11/2014 | Leen et al. |
| 8,902,071 B2 | 12/2014 | Barton et al. |
| 9,002,523 B2 | 4/2015 | Erickson et al. |
| 9,071,145 B2 | 6/2015 | Simard et al. |
| 9,080,784 B2 | 7/2015 | Dean-Hendricks et al. |
| 9,098,279 B2 | 8/2015 | Mucignat et al. |
| 9,143,006 B2 | 9/2015 | Lee et al. |
| 9,148,067 B2 | 9/2015 | Karlsson et al. |
| 9,206,993 B2 | 12/2015 | Barton et al. |
| 9,234,877 B2 | 1/2016 | Hattersley et al. |
| 9,261,287 B2 | 2/2016 | Warren et al. |
| 9,264,035 B2 | 2/2016 | Tousignant et al. |
| 9,272,647 B2 | 3/2016 | Gawade et al. |
| 9,366,448 B2 | 6/2016 | Dean-Hendricks et al. |
| 9,374,268 B2 | 6/2016 | Budde et al. |
| 9,419,602 B2 | 8/2016 | Tousignant et al. |
| 9,806,705 B2 * | 10/2017 | Landry ............... H02M 1/44 |
| 2001/0029585 A1 | 10/2001 | Simon et al. |
| 2001/0052459 A1 | 12/2001 | Essalik et al. |
| 2002/0011923 A1 | 1/2002 | Cunningham et al. |
| 2002/0022991 A1 | 2/2002 | Sharood et al. |
| 2002/0082746 A1 | 6/2002 | Schubring et al. |
| 2002/0092779 A1 | 7/2002 | Essalik et al. |
| 2003/0033230 A1 | 2/2003 | McCall |
| 2003/0034897 A1 | 2/2003 | Shamoon et al. |
| 2003/0034898 A1 | 2/2003 | Shamoon et al. |
| 2003/0040279 A1 | 2/2003 | Ballweg |
| 2003/0060821 A1 | 3/2003 | Hall et al. |
| 2003/0103075 A1 | 6/2003 | Rosselot |
| 2003/0177012 A1 | 9/2003 | Drennan |
| 2004/0262410 A1 | 12/2004 | Hull |
| 2005/0083168 A1 | 4/2005 | Breitenbach |
| 2005/0270151 A1 | 12/2005 | Winick |
| 2006/0112700 A1 | 6/2006 | Choi et al. |
| 2006/0196953 A1 | 9/2006 | Simon et al. |
| 2006/0242591 A1 | 10/2006 | Van Dok et al. |
| 2007/0013534 A1 | 1/2007 | DiMaggio |
| 2007/0045429 A1 | 3/2007 | Chapman, Jr. et al. |
| 2007/0114293 A1 | 5/2007 | Gugenheim |
| 2007/0114295 A1 | 5/2007 | Jenkins et al. |
| 2007/0119961 A1 | 5/2007 | Kaiser |
| 2007/0241203 A1 | 10/2007 | Wagner et al. |
| 2007/0277061 A1 | 11/2007 | Ashe |
| 2007/0289731 A1 | 12/2007 | Deligiannis et al. |
| 2007/0290924 A1 | 12/2007 | McCoy |
| 2007/0296260 A1 | 12/2007 | Stossel |
| 2008/0015740 A1 | 1/2008 | Osann |
| 2009/0143880 A1 | 6/2009 | Amundson et al. |
| 2009/0165644 A1 | 7/2009 | Campbell |
| 2010/0006660 A1 | 1/2010 | Leen et al. |
| 2010/0025210 A1 * | 2/2010 | Simard ............... G04C 23/347 200/33 R |
| 2010/0084482 A1 | 4/2010 | Kennedy et al. |
| 2010/0140070 A1 * | 6/2010 | Simard ............... G04C 23/347 200/33 R |
| 2010/0204834 A1 | 8/2010 | Comerford et al. |
| 2011/0073101 A1 | 3/2011 | Lau et al. |
| 2011/0133558 A1 | 6/2011 | Park |
| 2011/0185895 A1 | 8/2011 | Freen |
| 2011/0251807 A1 | 10/2011 | Rada et al. |
| 2011/0291606 A1 | 12/2011 | Lee |
| 2012/0323377 A1 | 12/2012 | Hoglund et al. |
| 2013/0158714 A1 | 6/2013 | Barton et al. |
| 2013/0158715 A1 | 6/2013 | Barton et al. |
| 2013/0158717 A1 | 6/2013 | Zywicki et al. |
| 2013/0158718 A1 | 6/2013 | Barton et al. |
| 2013/0158720 A1 | 6/2013 | Zywicki et al. |
| 2013/0213952 A1 | 8/2013 | Boutin et al. |
| 2013/0238142 A1 | 9/2013 | Nichols et al. |
| 2013/0245838 A1 | 9/2013 | Zywicki et al. |
| 2013/0261807 A1 | 10/2013 | Zywicki et al. |
| 2014/0062672 A1 | 3/2014 | Gudan et al. |
| 2014/0312131 A1 | 10/2014 | Tousignant et al. |
| 2014/0312697 A1 | 10/2014 | Landry et al. |
| 2015/0001929 A1 | 1/2015 | Juntunen et al. |
| 2015/0001930 A1 | 1/2015 | Juntunen et al. |
| 2015/0002165 A1 | 1/2015 | Juntunen et al. |
| 2015/0115045 A1 | 4/2015 | Tu et al. |

(56) References Cited

U.S. PATENT DOCUMENTS

| | | | |
|---|---|---|---|
| 2015/0144706 | A1 | 5/2015 | Robideau et al. |
| 2015/0145347 | A1 | 5/2015 | Kim et al. |
| 2015/0370265 | A1 | 12/2015 | Ren et al. |
| 2015/0370268 | A1 | 12/2015 | Tousignant et al. |
| 2016/0010880 | A1 | 1/2016 | Bravard et al. |
| 2017/0134214 | A1 | 5/2017 | Sethuraman et al. |
| 2017/0192061 | A1 | 7/2017 | Park |
| 2017/0235291 | A1 | 8/2017 | Foslien et al. |

FOREIGN PATENT DOCUMENTS

| | | |
|---|---|---|
| EP | 0070414 A1 | 1/1983 |
| EP | 0434926 B1 | 8/1995 |
| EP | 0976957 A2 | 2/2000 |
| EP | 0678204 B1 | 3/2000 |
| EP | 0985994 A1 | 3/2000 |
| EP | 1033641 A1 | 9/2000 |
| EP | 1143232 A1 | 10/2001 |
| EP | 1074009 B1 | 3/2002 |
| EP | 2138919 A1 | 12/2009 |
| FR | 2491692 A1 | 4/1982 |
| FR | 2711230 A1 | 4/1995 |
| WO | 9711448 A1 | 3/1997 |
| WO | 9739392 A1 | 10/1997 |
| WO | 0043870 A2 | 7/2000 |
| WO | 0152515 A1 | 7/2001 |
| WO | 0179952 A1 | 10/2001 |
| WO | 0223744 A2 | 3/2002 |
| WO | 2010021700 A1 | 2/2010 |

OTHER PUBLICATIONS

CorAccess, "Companion 6," User Guide, pp. 1-20, Jun. 17, 2002.
Danfoss RT51/51RF & RT52/52RF User Instructions, 2 pages, Jun. 2004.
DeKoven et al., "Designing Collaboration in Consumer Products," 2 pages, 2001.
DeKoven et al., "Measuring Task Models in Designing Intelligent Products," 2 pages, Jan. 13-16, 2002.
DESA Heating Products, "Wireless Hand-Held Remote Control Sets Models (C) GHRCB and (C)GHRCTB, Operating Instructions," 4 pages, May 2003.
Domotique Secant Home Automation—Web Page, available at http://www.secant.ca/En/Company/Default.asp, 1 page, printed Sep. 28, 2004.
Emme Core User Guide, Version 1.1, 47 pages, Jan. 2011.
Firex Smoke Alarm, Ionization Models AD, ADC Photoelectric Model Pad, 4 pages, prior to Apr. 21, 2005.
Fluke, "561 HVAC Pro" Infrared Thermometer User's Manual, 22 pages, Downloaded May 24, 2012.
Freudenthal et al., "Communicating Extensive Smart Home Functionality to Users of All Ages: the Design of a Mixed-Initiative Multimodal Thermostat-Interface," pp. 34-39, Mar. 12-13, 2001.
Gentex Corporation, HD135, 135° Fixed Temperature Heat Detector AC Pwered, 120V, 60Hz With Battery Backup, Installation Instructions—Owner's Information, pp. 1-5, Jun. 1, 1998.
Gentex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.
Harris et al., "Optimizing Memory Transactions," Microsoft Research Havard University, 12 pages, May 25, 2012.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System For Boiler Plant and Combustion Safety Processes," 4 pages, Dec. 15, 1995.
Honeywell T8002 Programmable Thermostat, Installation Instructions, pp. 1-8, 2002.
Honeywell T8602A,B,C,D and TS8602A,C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor-Integrated R7044 and FS90 Ver. 2.0," Operator Manual, 70 pages, Apr. 1995.
Honeywell, "Installation Guide: Wireless Entry/Exit Remote," 12 pages, 2011.
Honeywell, "Introduction of the S7350A Honeywell WebPAD Information Appliance," Home and Building Control Bulletin, 2 pages, Aug. 29, 2000; Picture of WebPad Device with touch screen, 1 Page; and screen shots of WebPad Device, 4 pages.
Honeywell, "RedLINK™ Wireless Comfort Systems," RedLINK Wireless Technology, 8 pages, Aug. 2011.
Honeywell, "Total Connect Online Help Guide," Revision A, 800-02577-TC, Mar. 2010.
Honeywell, "Total Connect User Guide," Revision B, 34 pages, May 15, 2012.
Honeywell, "VisionPRO® 8000 Thermostats," downloaded from http://yourhome.honeywell.com, 2 pages, May 24, 2012.
Honeywell, "W7006A Home Controller Gateway User Guide," 31 pages, Jul. 2001.
Honeywell, MagicStat® CT3200 Programmable Thermostat, Installation and Programming Instructions, pp. 1-24, 2001.
Honeywell, Wireless Entry/Exit Remote, Operating Manual, 9 pages, 2011.
http://hunter-thermostats.com/hunter_programmable_thermostats.html, Hunter Thermostat 44668 Specifications, and 44758 Specifications, 2 pages, Printed Jul. 13, 2011.
http://www.cc.gatech.edu/computing/classes/cs6751_94_fall/groupc/climate-2/node1.html, "Contents," 53 pages, printed Sep. 20, 2004.
http://www.ritetemp.info/rtMenu_13.html, Rite Temp 8082, 6 pages, printed Jun. 20, 2003.
http://www.thermostatsales.com, Robertshaw, "9610 Digital Programmable Thermostat," 3 pages, printed Jun. 17, 2004.
http://www.thermostatsales.com, Robertshaw, "9700 Deluxe Programmable Thermostat" 3 pages, printed Jun. 17, 2004.
http://www.thermostatsales.com, Robertshaw, "9710 Deluxe Programmable Thermostat," 3 pages, printed Jun. 17, 2004.
http://www.thermostatsales.com, Robertshaw, "9720 Deluxe Programmable Thermostat," 3 pages, printed Jun. 17, 2004.
Hunter, "44200/44250," Owner's Manual, 32 pages, prior to Jul. 7, 2004.
Hunter, "44300/44350," Owner's Manual, 35 pages, prior to Jul. 7, 2004.
Hunter, "Auto Saver 550", Owner's Manual Model 44550, 44 pages, prior to Jul. 7, 2004.
Hunter, "Model 44758 Remote Sensor," Owner's Manual, 2 pages, Revision Sep. 4, 2008.
Install Guide for Ritetemp Thermostat 8082, 6 pages, 2002.
Invensys™, "9700i 9701i 9715i 9720i Deluxe Programmable Thermostats," User's Manual, pp. 1-28, prior to Jul. 7, 2004.
Larsson, "Battery Supervision in Telephone Exchanges," Ericsson Components AB Sweden, 5 pages, Downloaded May 5, 2012.
Lennox, "Network Control Panel (NCP)," User's Manual, 18 pages, Nov. 1999.
Lennox, "Prodigy Control System," Lennox Industries, 4 pages, May 25, 2012.
Logitech, "Harmony 880 Remote User Manual," v. 1, pp. 1-15, prior to Nov. 30, 2007.
Lux ELV1 Programmable Line Voltage Thermostat, Installation Instructions, 3 pages, prior to Jul. 7, 2004.
Lux TX500 Series Smart Temp Electronic Thermostat, 3 pages, prior to Jul. 7, 2004.

(56) References Cited

OTHER PUBLICATIONS

Lux TX9000 Installation, 3 pages, prior to Apr. 21, 2005.
Lux, "9000RF Remote Instructions," 2 pages, prior to Nov. 30, 2007.
Lux, "511 Series Smart Temp Electronic Thermostat," Owner's Manual, 3 pages, prior to Jul. 7, 2004.
Lux, "600 Series Smart Temp Electronic Thermostat," Owner's Manual, 3 pages, prior to Jul. 7, 2004.
Lux, "602 Series Multi-Stage Programmable Thermostat," Owner's Manual, 2 pages, prior to Jul. 7, 2004.
Lux, "605/2110 Series Programmable Heat Pump Thermostat," Owner's Manual, 3 pages, prior to Jul. 7, 2004.
Lux, "700/9000 Series Smart Temp Electronic Thermostat," Owner's Manual, 3 pages, prior to Jul. 7, 2004.
Lux, "PSPH521 Series Programmable Heat Pump Thermostat," Owner's Manual, 3 pages, prior to Jul. 7, 2004.
Lux, "TX1500 Series Smart Temp Electronic Thermostat," Owner's Manual, 6 pages, prior to Jul. 7, 2004.
Metasys, "HVAC PRO for Windows User's Manual," 308 pages, 1998.
Mounting Template for Ritetemp Thermostat 8082, 1 page, 2002.
OMRON Electronic Components, LLC, "Micro Tilt Sensor D6B," Cat. No. JB301-E3-01, 6 pages, Mar. 2005.
OMRON Electronic Components, LLC, "Micro Tilt Sensor D6B," Cat. No. B02WAD1, 2 pages, Jun. 2002.
Operation Manual for Ritetemp Touch Screen Thermostat 8082, 8 pages, 2002.
PG&E, "SmartAC Thermostat Programming Web Site Guide," 2 pages, prior to Sep. 7, 2011.
Proliphix, "Web Enabled IP Thermostats, Intelligent HVAC Control," Proliphix Inc., 2 pages, on or before Aug. 28, 2004.
Proliphix, "Web Enabled IP Thermostats, Ultimate in Energy Efficiency!," Proliphix Inc., 2 pages, on or before Aug. 28, 2004.
Proliphix, Inc., "NT10e & NT20e," 54 pages, on or before Aug. 30, 2005.
Quick Start Guide for Ritetemp Thermostat 8082, 1 page, 2002.
Remote Control Power Requirement for Ritetemp Thermostat 8082, 1 page, 2002.
Ritetemp Operation 8029, 3 pages, Jun. 19, 2002.
Ritetemp Operation 8050, 5 pages, Jun. 26, 2002.
Ritetemp Operation 8085, pp. 1-6, prior to Apr. 21, 2005.
Saravanan et al, "Reconfigurable Wireless Interface for Networking Sensors," IJCSNS International Journal of Computer Science and Network Security, vol. 8 No. 7, pp. 270-276. Revised Jul. 20, 2008.
Screenshot of http://lagotek.com/index.html?currentSection=TouchIt, Lagotek, 1 page, prior to Mar. 29, 2012.
Sealed Unit Parts Co., Inc., Supco & CTC Thermostats . . . loaded with features, designed for value!, 6 pages, prior to Apr. 21, 2005.
Sharp Corporation, "GP1S036HEZ Phototransistor Output, Transmissive Photointerrupter with Tilt Direction (4-Direction) Detecting," pp. 1-11, Oct. 3, 2005.
Totaline Model P474-1035 Owner's Manual Programmable 5-2 Day Digital Thermostat, pp. 1-21, Apr. 2003.
Totaline Star CPE230RF, Commercial Programmable Thermostat Wireless Transmitter, Owner's Manual, pp. 1-16, Oct. 1998.
Totaline Star P/N P474-0130 Non-Programmable Digital Thermostat Owner's Manual, pp. 1-22, prior to Apr. 21, 2005.
Totaline, "1 For All Programmable Digital Thermostat," Owner's Manual P/N P374-1100FM, 23 pages, Nov. 1998.
Totaline, "1 For All Programmable Digital Thermostat," Owner's Manual P/N P474-1050, 21 pages, Nov. 1998.
Totaline, "1 For All Programmable Digital Thermostat," Owner's Manual P/N P374-1100, 24 pages, Apr. 2001.
Totaline, "Intellistat Combination Temperature and Humidity Control," Owner's Manual P/N P374-1600, 25 pages, Jun. 2001.
Totaline, "P/N P374-0431 Thermostat Remote Control and Receiver," Owner's Manual, 11 pages, prior to Nov. 30, 2007.
Totaline, "P474-1100RF, P474-1100REC Wireless Thermostat," 1 page, prior to Nov. 30, 2007.
Totaline, "Programmable Thermostat Configurable for Advanced Heat Pump or Dual Fuel Operation," Owner's Manual P/N P374-1500, 24 pages, Jun. 1999.
Totaline, "Wireless Remote Sensor, Model P474-0401-1RF/REC," 2 pages, prior to Nov. 30, 2007.
Totaline, "Instructions P/N P474-1010", Manual, 2 pages, Dec. 1998.
Totaline, "Programmable Thermostat", Homeowner's Guide, 27 pages, Dec. 1998.
Totaline, "Wireless Programmable Digital Thermostat," Owner's Manual 474-1100RF, 22 pages, 2000.
Trane, "System Programming, Tracer Summit Version 14, BMTW-SVP01D-EN," 623 pages, 2002.
Trane, "Wireless Zone Sensor. Where Will Wireless Technology Take You?," 4 pages, Feb. 2006.
Travis Industries, Remote Fireplace Thermostat, Part #99300651, 6 pages, printed Feb. 3, 2003.
Trouble Shooting Guide for Ritetemp Thermostat 8082, 1 page, 2002.
Visor Handheld User Guide, 280 pages, Copyright 1999-2000.
Warmly Yours, "Model TH1111GFCI-P (120 VAC)," Manual, pp. 1-4, prior to Jul. 7, 2004.
Cirrus Logic, Inc., "CS1501 Digital Power Factor Correction Control IC," 16 pages, 2012.
International Search Report for Corresponding Application No. PCT/US2014/044229, dated Oct. 13, 2014.
U.S. Appl. No. 14/300,232, filed Jun. 9, 2014.
Hendon Semiconductors, "OM1894 Dual Sensing Precision Triac Control," Product Specification, Rev. 2.0, 21 pages, Apr. 19, 2007.
Honeywell, "System Installation Guide: Important Instructions," Honeywell International Inc., 25 pages, 2011.
http://www.dimplex.com/en/home_heating/linear_convector_baseboards/products/lpc_series/linear_proportional_convector, Dimplex Coporation, "Linear Convector LPC Series," 2 pages, May 2011.
http://www.enernetcorp.com/, Enernet Corporation, "Wireless Temperature Control" 1 page, 2011.
http://www.enernetcorp.com/t9000-wireless-thermostat.html, Enernet Corporation, "T9000 Series Wireless Fan Coil Thermostat," Product Brochure, 2 pages, 2011.
http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
http://www.enocean-alliance.org/en/products/regulvar_rw-tp01/, Regulvar Corporation, "RW-TP01, Capteur de température sans fil" 3 pages, Aug. 9, 2009.
http://www.forwardthinking.honeywell.com/products/wireless/focus_pro/focus_pro_feature.html, Honeywell Corporation, "Wireless FocusPRO® pages", 2 pages, 2011.
Signetics Linear Products, "TDA1024 Zero Crossing Triac Trigger," Product Specification, 14 pages, Sep. 1985.
"RCS X10 Thermostat Plug-in for HomeSeer Beta Version 2.0.105," 25 pages, prior to Sep. 7, 2011.
"CorAccess Systems/In Home," http://web.archive.org/web20011212084427/www.coraccess.com/home.html, 1 page, copyright 2001, printed Aug. 19, 2004.
"HAI Company Background," http://www.homeauto.com/AboutHAI/abouthai_main.htm, 2 pages, printed Aug. 19, 2004.
"High-tech options take hold in new homes—200-08-28—Dallas Business Journal," http://bizjournals.com/dallas/stories/2000/08/28/focus4, 3 pages, dated Aug. 28, 2000, printed Aug. 19, 2004.
"Home Toys Review—TouchLinc", http://www.hometoys.com/htinews/aug99/reviews/touchlinc/touchlinc.htm, 3 pages, dated Aug. 1999, printed Aug. 20, 2004.
"HTI News Release," http://www.hometoys.com/htinews/apr99/releases/ha101.htm, 3 pages, Apr. 1999.
"Mark of Excellence Award Finalist Announced," http://64.233.167.104/search?Q=cache:ciOA2YtYaBIJ:www.hometoys.com/releases/mar . . . , 6 pages, Leopard Touchscreen on p. 2, dated prior to Mar. 4, 2000, printed Aug. 20, 2004.
"Product Review—Philips Pronto Remote Control," http://hometheaterhifi.com/volume_6_2/philipsprontoremotecontrol.html, 5 pages, dated May 1999, printed Aug. 20, 2004.

(56) References Cited

OTHER PUBLICATIONS

"RC X10 Automation Forum: Control your Heating and Cooling System with Pronto(1/1)," http://www.remotecentral.com/cgi-bin/mboard/rc-x10/thread.cgi?12, 2 pages, dated Apr. 23, 1999, printed Aug. 20, 2004.
"Spotlight on integrated systems," Custom Builder, vol. 8, No. 2, p. 66(6), Mar.-Apr. 1993.
"Vantage Expands Controls for Audio/Video, HVAC and Security," http://www.hometoys.com/htinews/aug99/releases/vantage03.htm, 2 pages, dated Aug. 3, 1999, printed Aug. 20, 2004.
ADI, "Leopard User Manual," 93 pages, 2001.
Adicon 2500, "The Automator," 4 pages, Oct.-Dec. 2000.
ADT Security Services, "iCenter Advanced User Interface 8142ADT," Installation and Setup Guide, 4 pages, May 2001; First Sale Feb. 2001.
AED Electronics, Inc., "Presenting Climatouch the Most Innovative Thermostat in the World!," 2 pages, prior to Nov. 30, 2007.
Andrews et al., "Clicky: User-Centric Input for Active Spaces," 17 pages, Aug. 2004.
Aprilaire Electronic Thermostats Models 8344, 8346, 8348, 8363, 8365, 8366 Operating Instructions, 8 pages, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program" Illustration, 3 pages, Apr. 6, 2001.
Blake et al., "Seng 310 Final Project" Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owner's Manual, pp. 1-17, 2001.
BRK Electronics Maximum Protection Plus Ultimate Convenience Smoke Alarm, 24 pages, Sep. 2000.
BRK First Alert, User's Manual, Smoke and Fire Alarms, pp. 1-7, Nov. 2002.
Business Wire, "MicroTouch Specialty Products Group to Capitalize on Growing Market for Low-Cost Digital Matrix Touchscreens," p. 1174 (2 pages), Jan. 6, 1999.
Cardio Manual, available at http://www.secant.ca/En/Documentation/Cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTINews Review," Feb. 1998, 5 pages, printed Sep. 14, 2004.
Carrier Microelectronic Programmable Thermostat Owner's Manual, pp. 1-24, May 1994.
Carrier TSTATCCRF01 Programmable Digital Thermostat, pp. 1-21, prior to Apr. 21, 2005.
Carrier, "Edge Performance Programmable Owner's Manual," 64 pages, 2007.
Carrier, "Programmable Dual Fuel Thermostats," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable Thermostat," Homeowner's Manual, pp. 1-8 pages, 1998.
Carrier, "Thermidistat Control, Installation, Start-Up, and Operating Instructions," pp. 1-12, Aug. 1999.
Carrier, "Comfort Programmable Owner's Manual," Carrier Touch-N-Go, Catalog No. 0M-TCPHP-4CA 60 pages, 2010.
White-Rodgers 1F80-224 Programmable Electronic Digital Thermostat, Installation and Operation Instructions, 8 pages, prior to Apr. 21, 2005.
White-Rodgers Comfort-Set III Thermostat, pp. 1-44, prior to Jul. 7, 2004.
White-Rodgers Installation Instructions for Heating & Air Conditioning IF78 Non-Programmable Thermostat, 6 pages, prior to Apr. 21, 2005.
White-Rodgers Installation Instructions for Heating & Air Conditioning IF78 5/2 Day Programmable Thermostat, 7 pages, prior to Jul. 7, 2004.
White-Rodgers, "Installation Instructions for Heating & Air Conditioning IF72 5/2 Day Programmable Heat Pump Thermostat," 8 pages, prior to Jul. 7, 2004.
White-Rodgers, "Comfort-Set 90 Series Thermostat," Manual, pp. 1-24, prior to Jul. 7, 2004.
White-Rodgers, 1F80-240 "(for Heating Only systems) Programmable Electronic Digital Thermostat," Installation and Operation Instructions, 8 pages, prior to Jul. 7, 2004.
White-Rodgers, 1F80-241 "Programmable Electronic Digital Thermostat," Installation and Operation Instructions, 6 pages, prior to Jul. 7, 2004.
White-Rodgers, 1F80-261 "Programmable Electronic Digital Thermostat," Installation and Operation Instructions, 8 pages, prior to Jul. 7, 2004.
White-Rodgers, 1F81-261 "Programmable Electronic Digital Multi-Stage Thermostat," Installation and Operation Instructions, 8 pages, prior to Jul. 7, 2004.
White-Rodgers, 1F82-261 "Programmable Electronic Digital Heat Pump Thermostat," Installation and Operation Instructions, 8 pages, prior to Jul. 7, 2004.
White-Rodgers, Comfort-Set 90 Series Premium, 4 pages, prior to Apr. 21, 2005.
www.icmcontrols.com, Simplecomfort, SC3000 Single Stage Heat/Single Stage Cool or Single Stage Heat Pump/Manual Changeover, 1 page, prior to Jul. 7, 2004.
www.icmcontrols.com, Simplecomfort, SC3001 Single Stage Heat/Single Stage Cool or Single Stage Heat Pump/Manual Changeover, 1 page, prior to Jul. 7, 2004.
www.icmcontrols.com, Simplecomfort, SC3006 Single Stage Heat/Single Stage Cool or Single Stage Heat Pump/Manual Changeover, 1 page, prior to Jul. 7, 2004.
www.icmcontrols.com, Simplecomfort, SC3201 2 Stage Heat Pump Manual Changeover, 1 page, prior to Jul. 7, 2004.
www.icmcontrols.com, Simplecomfort, SC3801 2 Stage Heat/2 Stage Cool 2 Stage Heat Pump/Audio Changeover, 1 page, prior to Jul. 7, 2004.
Inventek, "Inventek Systems, ISM4319-M3X-L44-X Embedded Serial-to-Wi-Fi Module eS-WiFi 802.11 b/g/n Data Sheet", ,Inventek, "Inventek Systems, ISM4319-M3X-L44-X Embedded Serial-to-Wi-Fi Module eS-WiFi 802.11 b/g/n Data Sheet", accessed from http://www.inventeksys.com/wp-content/uplo . . . Feb. 6, 2012.
Office Action for Canadian Application No. 2,774,907, dated Nov. 3, 2017.

* cited by examiner

US 10,396,770 B2

ACTIVE TRIAC TRIGGERING CIRCUIT

This application is a continuation of U.S. patent application Ser. No. 13/868,716, filed Apr. 23, 2013. U.S. patent application Ser. No. 13/868,716, filed Apr. 23, 2013, is hereby incorporated by reference.

BACKGROUND

The present disclosure pertains to thermostats and particularly to various kinds of power supplies for thermostats.

SUMMARY

The disclosure reveals a power supply unit for use with thermostats or other like devices requiring power. A power supply unit may be designed to keep electromagnetic interference emissions at a minimum, particularly at a level that does not violate governmental regulations. A unit may be designed so that there is enough power for triggering a switch at about a cross over point of a waveform of input power to the unit. Power for triggering may come from a storage source rather than line power to reduce emissions on the power line. Power for the storage source may be provided with power stealing. Power stealing may require switching transistors which can generate emissions. Gate signals to the transistors may be especially shaped to keep emissions from transistor switching at a minimum.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Figure 1:
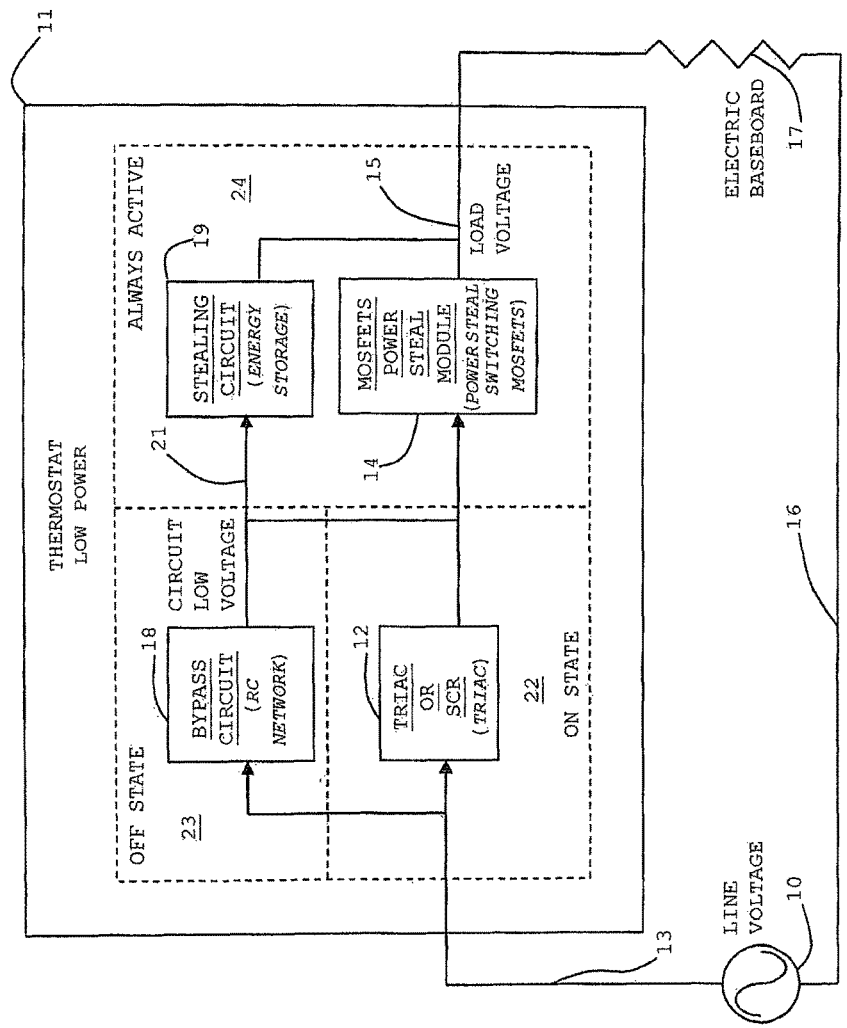
FIGS. 1 and 2 are diagrams of a thermostat power supply unit for low and high power, respectively.

A triac 12 or bypass circuit 18 and a MOSFET power steal 14 combination may be noted (FIG. 1). Two-wire devices may need power stealing functionality to supply their electronics, and conditioned triac triggering functionality to comply with FCC title 47 part 15 sub B, EMI conducted emissions regulations.

The triggering functionality need may involve using active triggering which in turn requires high power in order to deliver consistent and reliable performance at a triac gate. Active triggering may be defined as the ability to store energy and supply it to trigger the triac 12 near zero-crossing when a power line's energy is not sufficient.

One way of supplying high power to the electronics may be a use of a serial MOSFETs power stealing approach. Another approach may be to delay the triac trigger, but this approach might not comply with FCC regulations.

Current transformers may also be used but they might not be able, in the load range and size available, to supply the high power requirement for the active triac triggering and thus not comply with FCC regulations.

A thermostat device may have two states. First, the ON state 22 (FIG. 1) is when a heating demand is ON while the entire device is operating with triac 12 ON. Second, the OFF state 23 may be when the heating demand is OFF while the device remains in operation with triac 12 OFF.

A triac 12 and MOSFET 14 combination for the ON state 22 does not appear to have been done or been used in a thermostat.

For the OFF state 23, a triac bypass circuit 18 may be needed to supply power to thermostat electronics. Depending on power requirements, bypass circuit 18 may be an AC-DC converter for high power such as for RF applications, an RC (resistor-capacitor) network for moderate or low power, or an R (resistor) only network for rather low power.

Virtually any kind of a bypass supply approach may be used because the triac triggering approach can be independent of the bypass supply approach which is not necessarily the case in a related art OFF state supply approach of an R network with a current transformer or triac trigger being delayed.

The present thermostat topology may be a key combination for FCC compliance. It may provide a solution for in-line line-volt thermostats.

Bypass circuit 18 may be scaled to accommodate a full range of thermostats' energy requirements such as RF energy hungry applications (e.g., wifi, zigbee, RF host modules, and so forth), RF moderate or low energy applications (e.g., RF client modules, and so forth), and the usual programmable or non-programmable thermostats. Also, the triac switch component 12 may be changed to an SCR (thyristor) or a relay with minor adjustments to circuitry.

Figure 3:
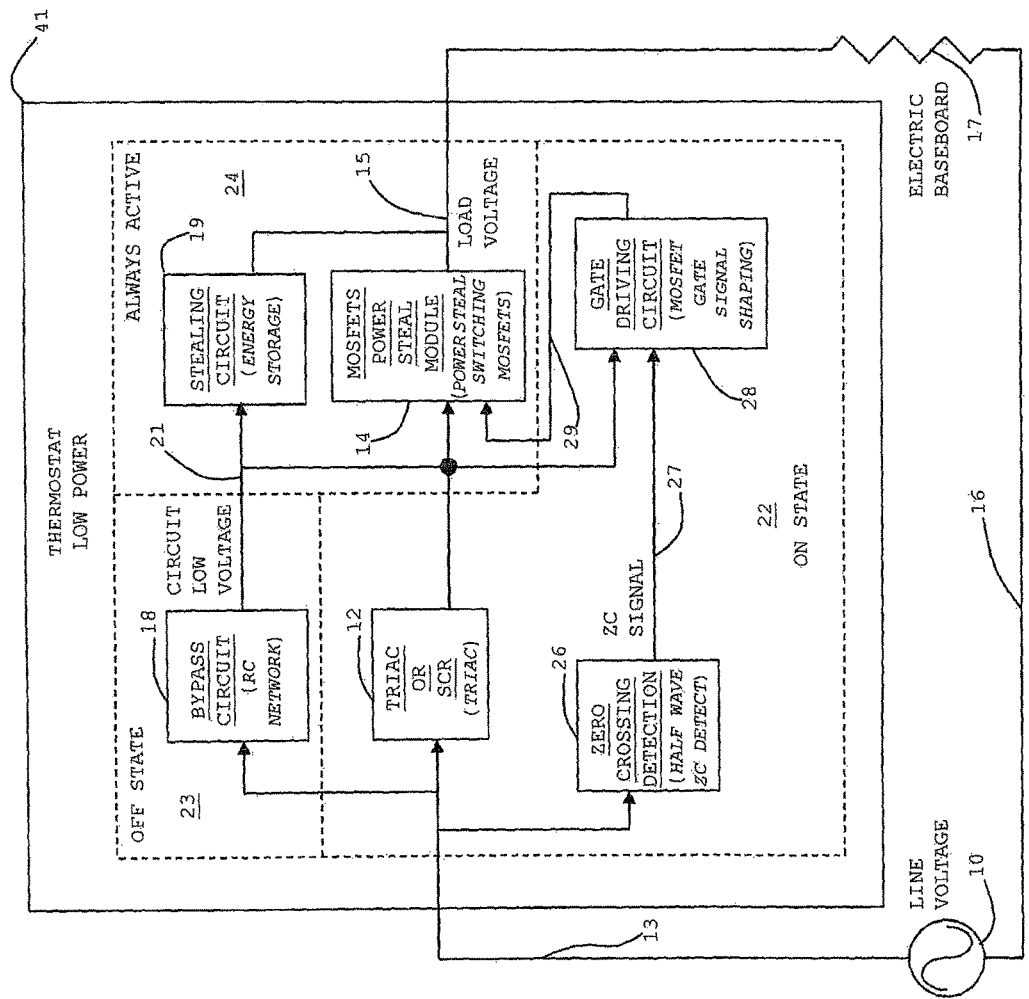
FIGS. 3 and 4 are diagrams of a thermostat power supply having a gate driving circuit for low and high power, respectively.
Figure 4:
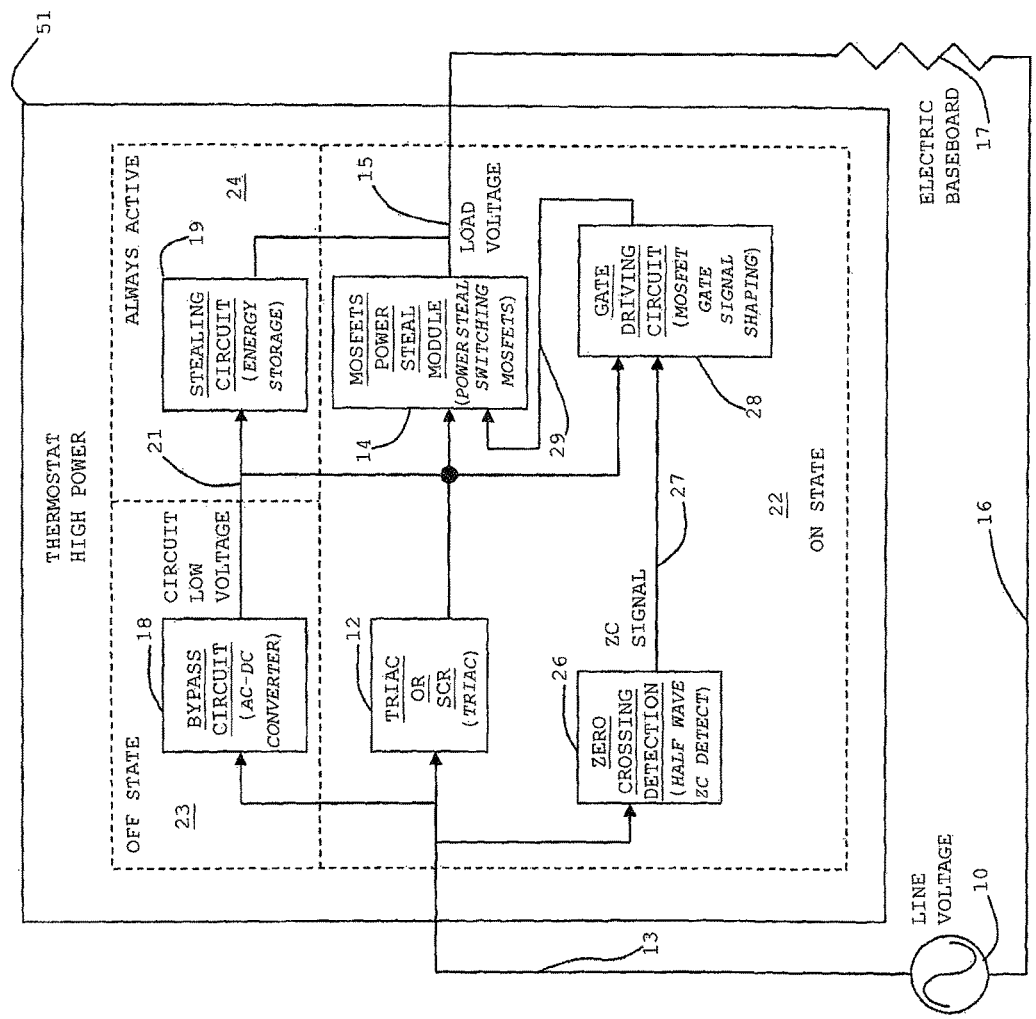

A MOSFET gate driving circuit 28 for transition softening may be noted in FIGS. 3 and 4. Two-wire devices may need power stealing functionality to supply their electronics. When this power stealing is done with serial MOSFETs 14, they may need to be triggered in such a way that turning MOSFETs ON/OFF complies with FCC regulations.

By having a circuit 28 that may control the rate of charge and discharge of the MOSFET gates, the gate switching behaviors may be controlled, and thus control the current and voltage transition generated by the power steal module 14. Such control may enable one to reduce EMI conducted emissions.

A circuit 28 may do a positive zero crossing power steal and use two current limiting devices to control the rate of charge and discharge of the MOSFET gates, respectively. The circuit may also use latching circuitry enabled by a voltage level detector, to keep the MOSFETs state until the next power steal.

Some approaches may use a current transformer or the triac itself to do the power steal. In both cases, the triac transition cannot necessarily be controlled in such a way that will comply with FCC regulations. The MOSFET transition may need to be smoothed. The present circuit may soften a MOSFET transition. In this case, one may use the circuit to reduce EMI conducted emissions produced by a current zero crossing power stealing circuit using MOSFETs.

An active triac 12 may be noted. In order to comply with FCC emission regulations, triac triggering may need to be controlled in such a way that EMI noise emitted on the AC main lines is kept low. This functionality may be accomplished by an active triggering.

Active triac triggering may be done with the present approach in thermostats. The approach may result in reduced EMI conducted emissions generated by triac 12. Active triggering may be defined as the ability to store energy and supply the energy to trigger triac 12 near zero-crossing when power line's energy is not sufficient. Previously, passive triggering may have been used, which meant triggering triac 12 with energy directly from a power line 13.

Active triac triggering may be done from a continuous or pulsed DC source. Triac 12 may work in quadrants II and III. The triggering may also be done from an alternating continuous or pulsed DC source. Triac 12 may work in quadrants I and III.

Figure 5:
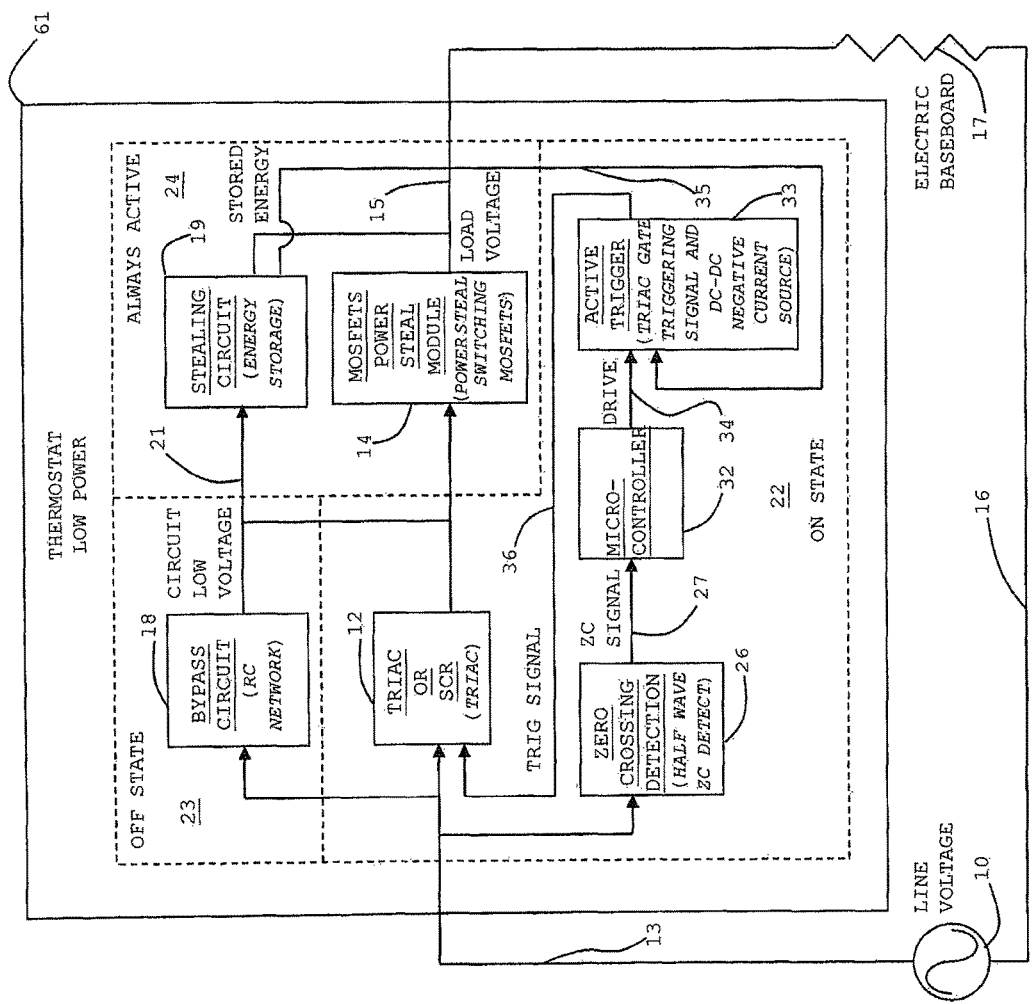
FIGS. 5 and 6 are diagrams of a thermostat power supply having an active trigger circuit for low and high power, respectively.
Figure 6:
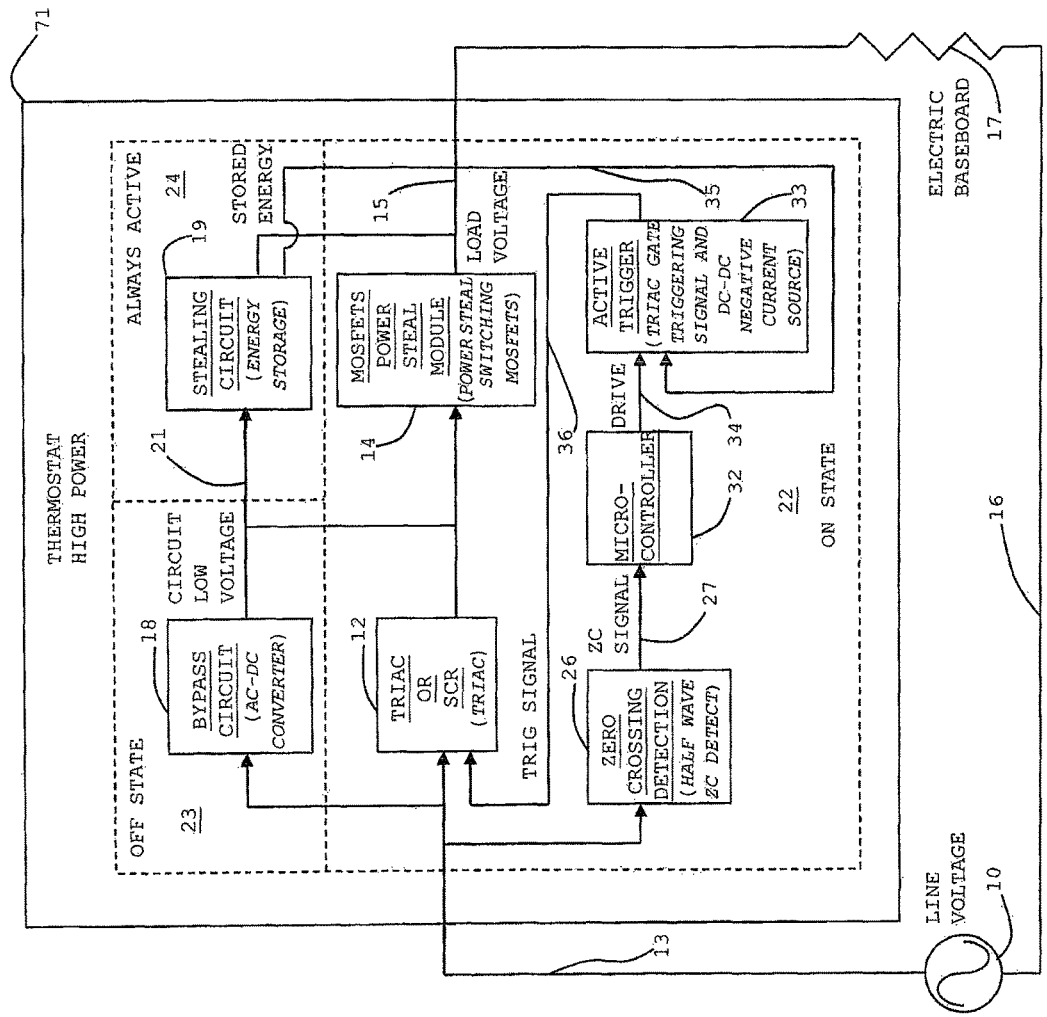
Figure 7:
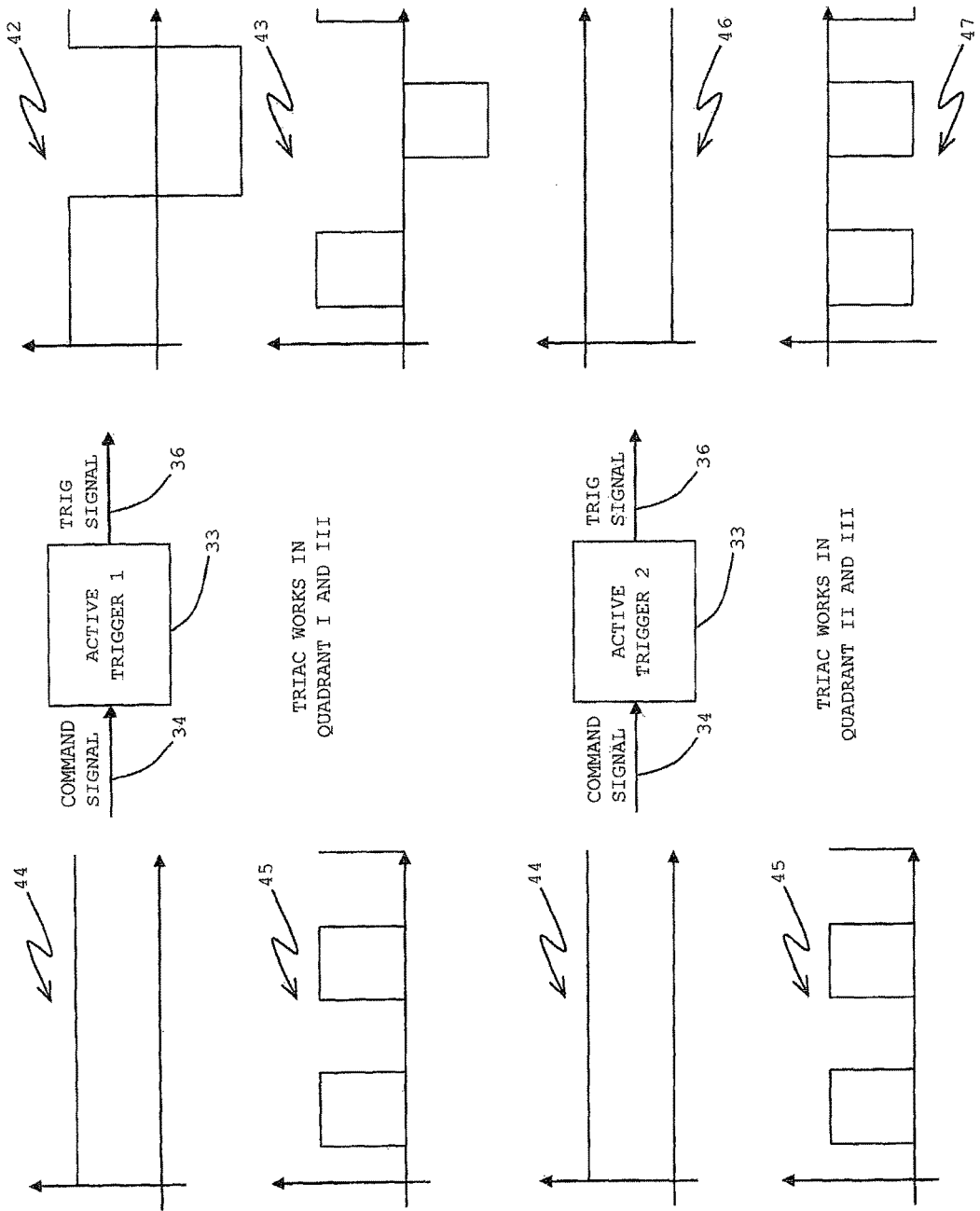
FIG. 7 is a diagram of various waveforms applicable to the active trigger circuit.

To activate the circuit, a command signal or drive 34 may be applied at an input of an active trigger circuit 33 as illustrated in FIGS. 5-7. Command signal 34 may be synchronized with the current zero crossing from AC line 13. The shape of an active triggering signal 36 may depend on the shape of the input command signal 34 and on the logic of active trigger circuit 33.

For triac quadrants I and III, the practice may be to alternate the trig 36 between positive and negative signals as shown by the signal profiles 42 and 43. Command signal 34 may be continuous or pulsed as shown by signal profiles 44 and 45, respectively.

For triac quadrants II and III, the practice may be to provide a negative trig signal 36 as shown by signal profiles 46 and 47. The command signal 34 to active trigger circuit 33 may be continuous or pulsed as shown by signal profiles 44 and 45, respectively.

A choice of active triggering circuits may depend on the thermostat complexity combined with the energy consumption needed. An alternating DC source may be more complex. Pulse triggering may consume less power. The noted active triggering approaches may reduce EMI conducted emissions produced by the triac.

FIG. 1 is a diagram of a power supply unit 11 for a thermostat needing low power. Unit 11 may have a triac or SCR module 12 having an input connected to a line voltage 13. Module 12 may have a relay or some triggerable switch. A MOSFET power steal module 14 may have an input connected to an output of module 12 via line 21. An output of module 14 may be connected to a load voltage line 15. A source 10 may provide AC power on line voltage 13 and line 16. Line 16 may be connected to one end of an electric baseboard 17. Another end of baseboard 17 may be connected to line 15.

A bypass circuit 18 may have an input connected to line voltage 13. An output of circuit 18 may be a circuit low voltage line 21 connected to an input of stealing circuit 19. Unit 11 layout may be divided into three areas including an on state area 22, an off state area 23, and an always active area 24. Modules 12 may be in area 22. Circuit 18 may be in area 23, and circuit 19 and 14 may be in area 24. A component of the triac or SCR module 12 may be a triac. Components of the MOSFET power steal module 14 may incorporate power steal switching MOSFETs. A component of bypass circuit 18 may be an RC network. A component of stealing circuit 19 may be for energy storage.

Figure 2:
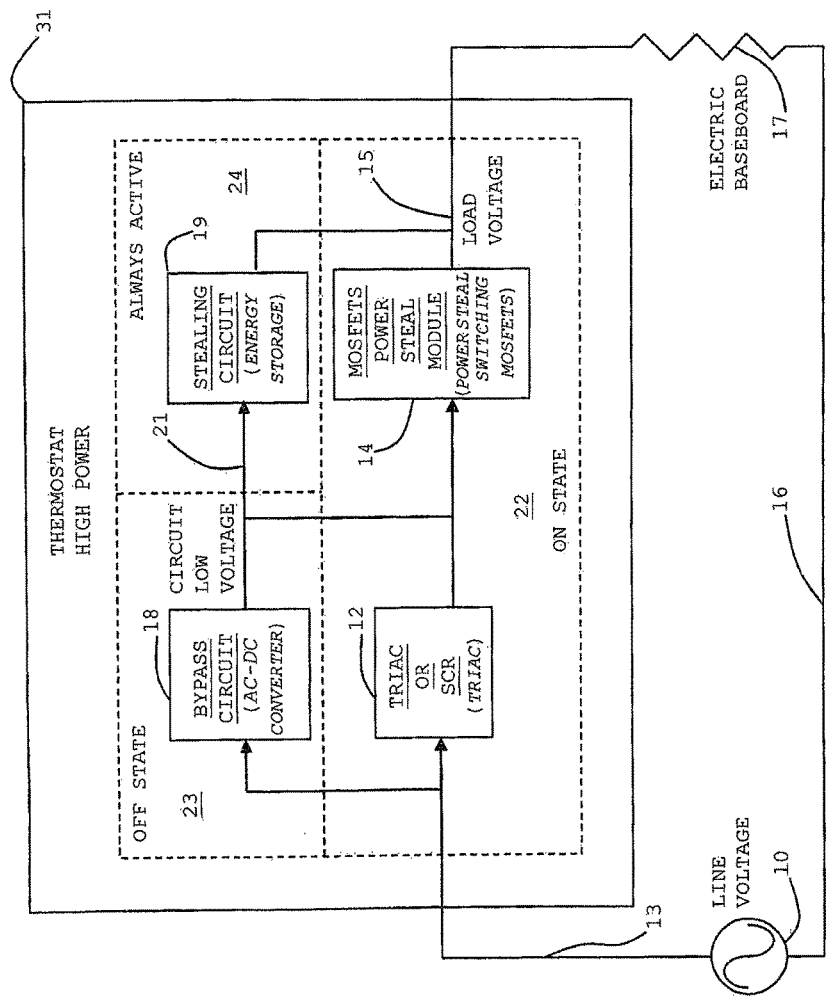

FIG. 2 is a diagram of a power supply unit 31 for a thermostat needing more power like RF applications. Unit 31 may be similar to unit 11 of FIG. 1 except that the component of circuit 18 may instead be an AC-DC converter and the MOSFET power steal module is in the area 22.

FIG. 3 is a diagram of a power supply unit 41 for a thermostat needing low power. Unit 41 may be similar to unit 11 of FIG. 1 except that unit 41 may incorporate a zero crossing (ZC) detection module 26 in area 22. An input of module 26 may be connected to line voltage 13. An output from module 26 may be a ZC signal on a line 27 to an input of a gate driving circuit 28. Also to an input of circuit 28 may be the circuit low voltage on line 21. An output from circuit 28 may go to an input of module 14 via a line 29. Module 26 may incorporate a half wave ZC detect component. Circuit 28 may incorporate a MOSFET gate signal shaping component.

FIG. 4 is a diagram of a power supply unit 51 for a thermostat needing high power for RF applications. Unit 51 may be similar to unit 41 of FIG. 3 except that the component of circuit 18 may instead be an AC-DC converter and the MOSFET power steal module is in the area 22.

FIG. 5 is a diagram of a power supply unit 61 for a thermostat using low power. Unit 61 may be similar to unit 41 of FIG. 3 except that unit 61 does not necessarily incorporate the gate driving circuit 28 and may incorporate a microcontroller 32 and an active trigger module 33 in area 22. ZC signal may go on line 27 to an input of microcontroller 32. A drive signal on a line 34 may go to an input of active trigger module 33. Stored energy may proceed from an output of circuit 19 to an input of module 33 via a line 35. A trig signal from an output of module 33 may proceed along a line 36 to an input of module 12.

FIG. 6 is a diagram of a power supply unit 71 for a thermostat needing high power. Unit 71 may be similar to unit 61 of FIG. 5 except that the component of circuit 18 may be an AC-DC converter and the MOSFET power steal module is in the area 22. Units 61 and 71 may be expanded to incorporate the gate driving circuit 28 arrangement of units 41 and 51.

Figure 8:
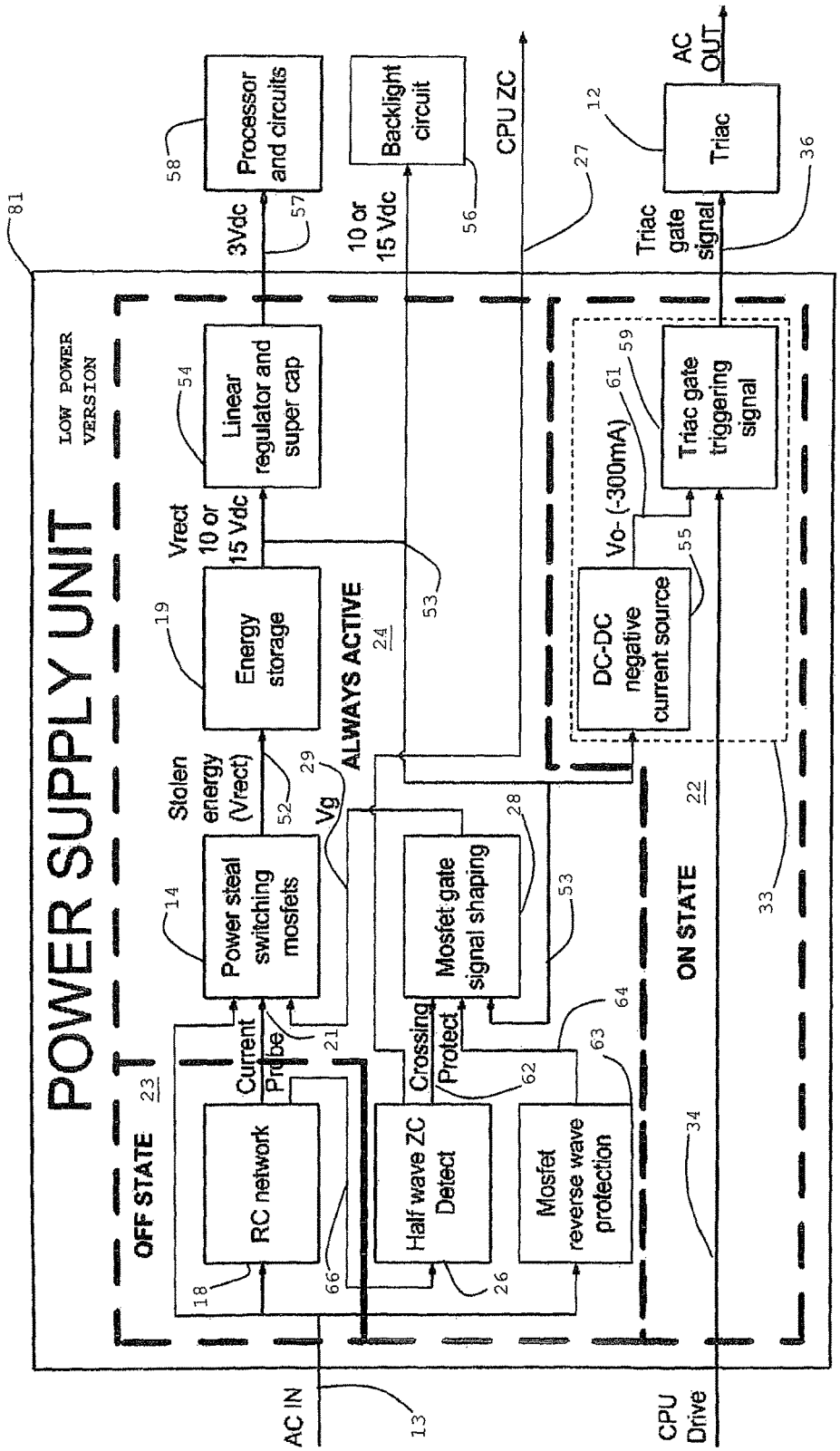
FIGS. 8 and 9 are more detailed diagrams of the thermostat power supply for low and high power, respectively.

FIG. 8 is a diagram of a low power version of a power supply unit 81 having resemblances to units 11, 31, 41, 51, 61 and 71 of FIGS. 1-6, respectively. An RC network of a bypass circuit 18 may output current along connection 21 to power stealing switching MOSFETs. Power steal module 14 along connection 52 may provide stolen energy (Vrect) to energy storage module or stealing circuit 19. A connection 53 may provide energy at a level (Vrect) 10 or 15 Vdc to a linear regulator and super cap circuit 54, the gate driving circuit of MOSFET signal shaping circuit 28, a DC-DC negative current source 55 of active trigger module 33, and a backlight circuit 56.

Regulator and super cap circuit 54 may provide 3 Vdc power along connection 57 to a processor and other circuits 58. Zero crossing detector 26 having an input along connection 66 from bypass circuit 18 and a half wave ZC detect of detector 26 may provide a zero crossing signal along a connection 27 to a CPU 32. A drive signal from CPU 32 along a connection 34 may go to a triac gate triggering signal circuit 59 of active trigger module 33. The DC-DC negative current source 55 may provide energy at Vo with a current of a negative 300 mA along a connection 61 to the triac gate triggering signal circuit 59.

A zero crossing signal may go on connection 62 from detector 26 to the gate signal shaping circuit 28. A MOSFET reverse wave protection circuit 63 may have an input from line 13 and a protect signal output on connection 64 to circuit 28.

Figure 9:
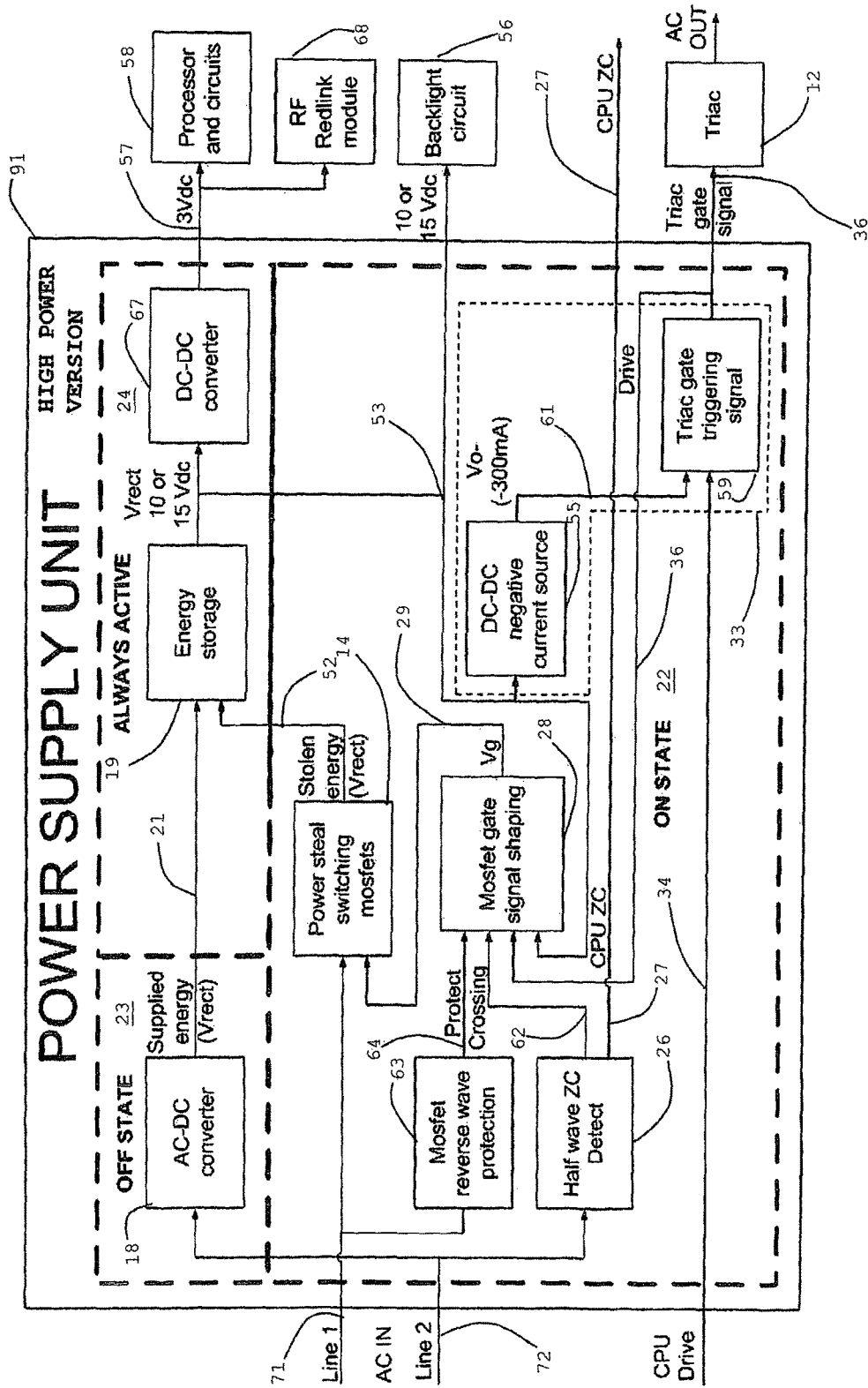

FIG. 9 is a diagram of a high power version of a power supply unit 91 which appears similar to unit 81 of FIG. 8. Line power 13 of other units may be presented as two lines 1 and 2 at unit 91. Power 71 of line 1 may be provided to power steal module 14 and MOSFET reverse wave protection circuit 63. Power 72 of line 2 may be provided to bypass circuit 18 and half wave ZC detector of circuit 26.

In contrast to unit 81, bypass circuit 18 of unit 91 may have an AC-DC converter in lieu of an RC network. AC-DC converter may supply energy (Vrect) on connection 21 to energy storage module 19. In lieu of linear regulator and super cap circuit 54, unit 91 may have a DC-DC converter 67. An output of converter 67 may be 3 Vdc to processor and circuits 58 and RF Redlink™ module 68. RF Redlink™ module 68 may also be a Wifi module or any other RF protocol. Another distinction between units 81 and 91 may be connection 36 being extended as an input to gate signal shaping circuit 28.

Figure 10:
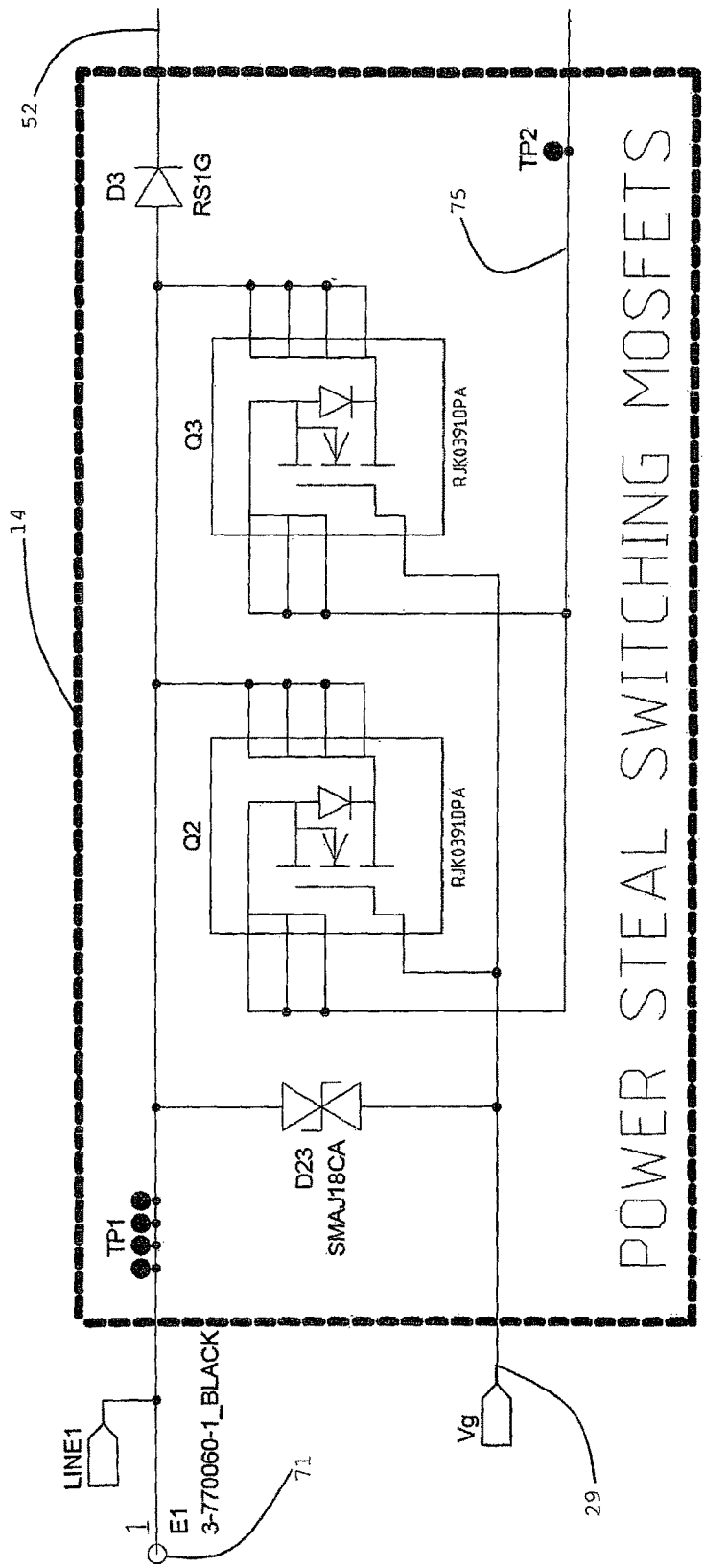
FIG. 10 is a diagram of a power steal switching transistors circuit.
Figure 11:
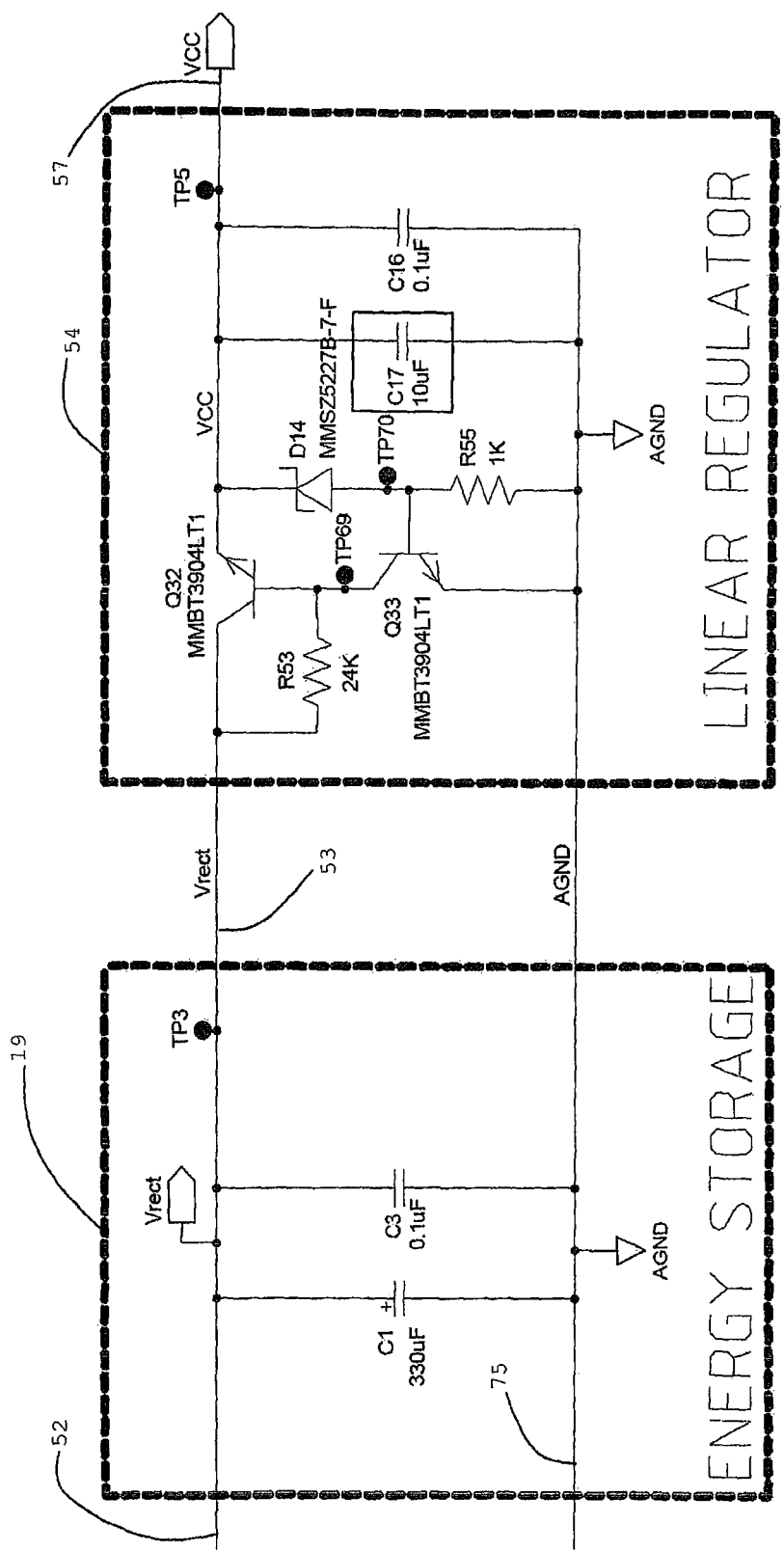
FIG. 11 is a diagram of an energy storage module and a linear regulator.

FIGS. 10-17 are diagrams for circuitry of various parts of unit 81. FIG. 10 is a diagram of power steal switching MOSFETs 14 showing a line 1, which may be of power 13 and be designated as line 71. Also, there may be connections 29 and 52, and ground terminal 75. FIG. 11 is a diagram of energy storage module 19 and linear regulator 54. Also shown are connections 52, 53 and 57, and ground terminal 75.

Figure 12:
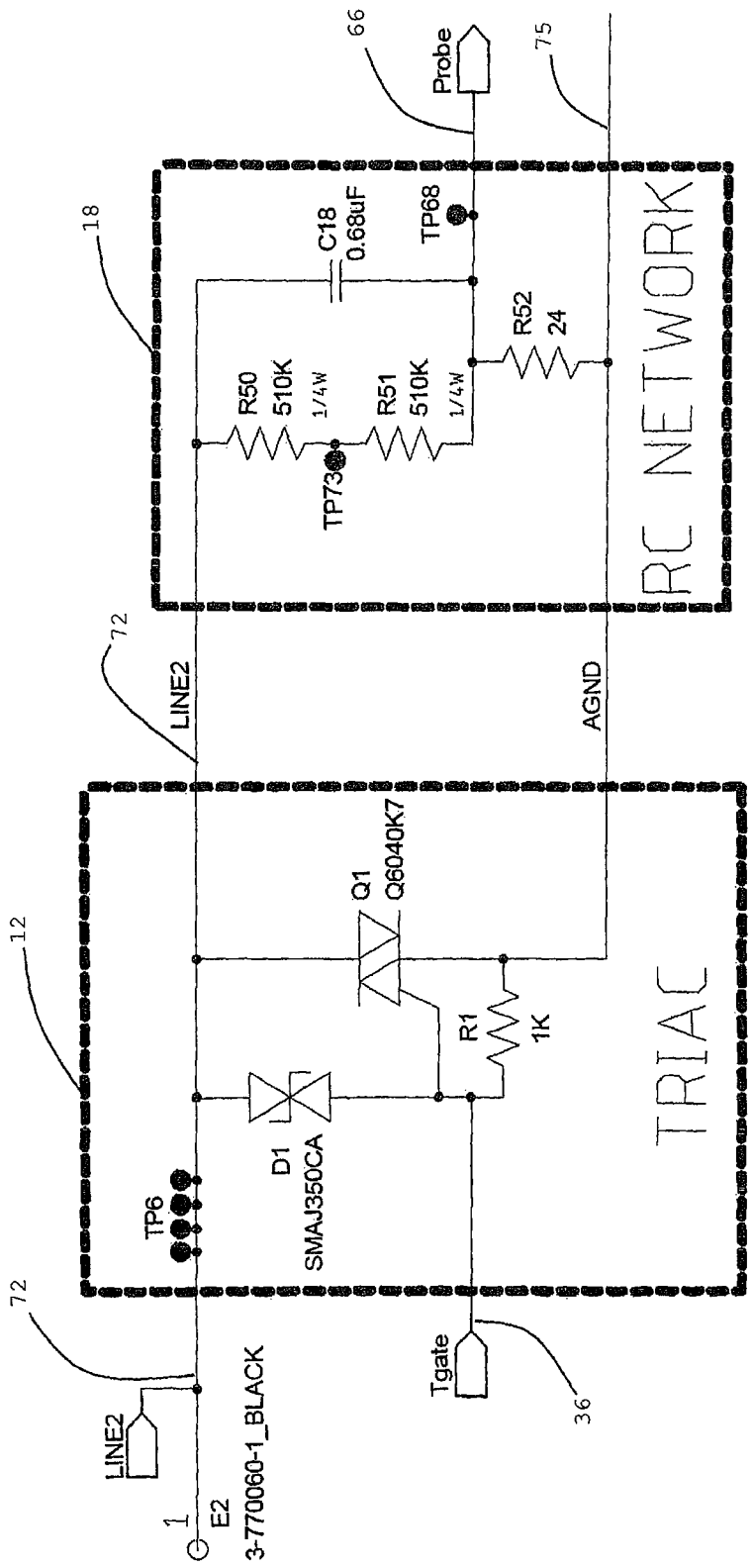
FIG. 12 is a diagram of a triac and an RC network.
Figure 13:
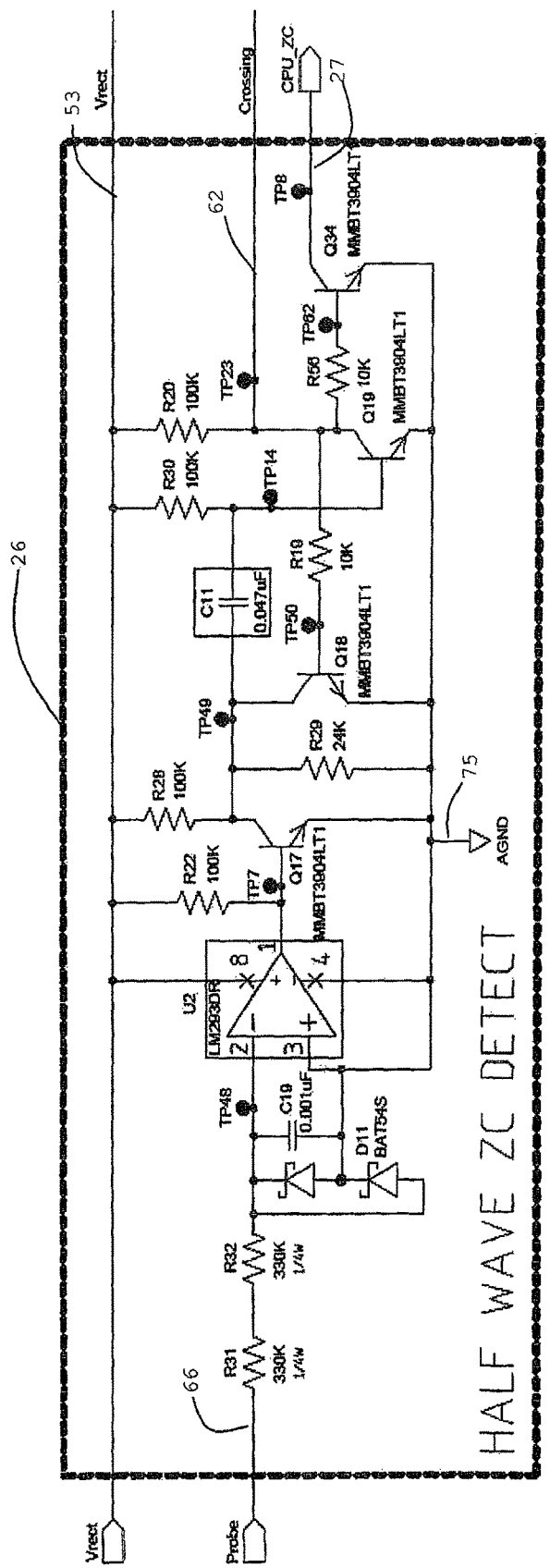
FIG. 13 is a diagram of a half wave zero crossing detect circuit.

FIG. 12 is a diagram of a triac circuit 12 and an RC network of bypass circuit 18 along with line 2, which may be of power 13 and designated as line 72. Also there may be connections 66 and 36, and ground terminal 75. FIG. 13 is a diagram of a half wave ZC detect circuit 26 along with connections Vrect 53, a connection 66, crossing connection 62, CPU ZC connection 27, and ground terminal 75.

Figure 14:
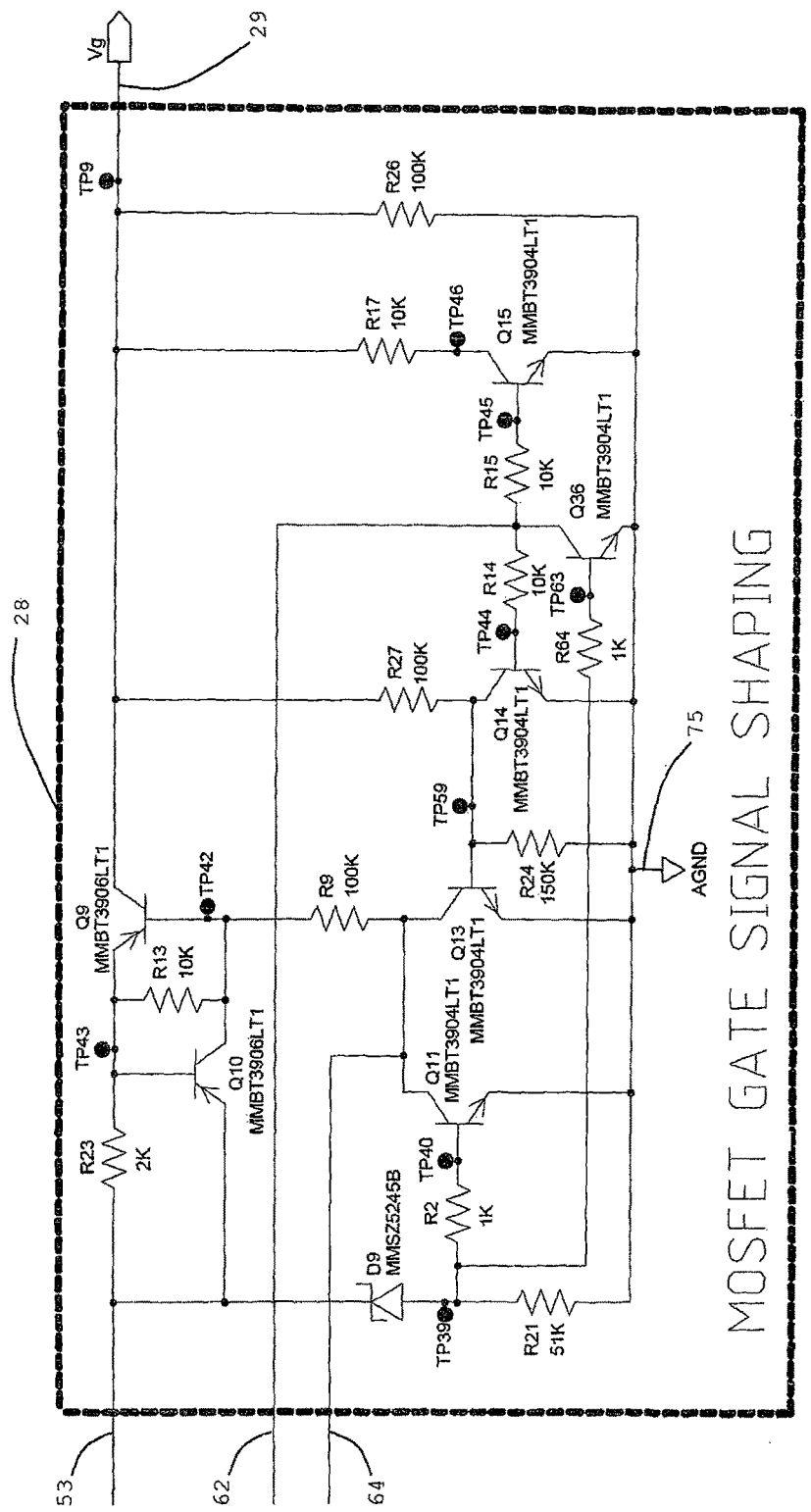
FIG. 14 is a diagram of a gate signal shaping circuit.
Figure 15:
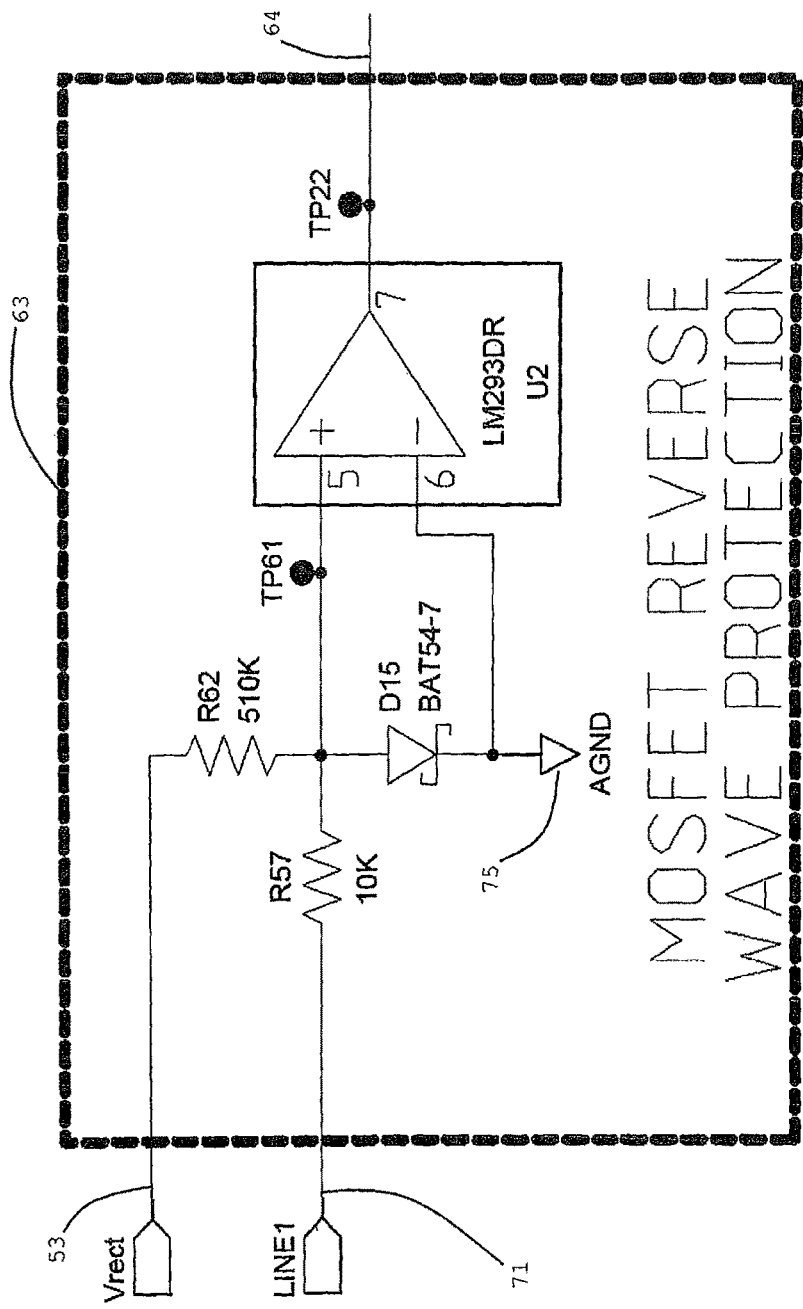
FIG. 15 is a diagram of a transistor reverse wave protection circuit.

FIG. 14 is a diagram of the gate signal shaping circuit 28. Also shown are connections 53, 62, 64 and 29, and ground terminal 75. FIG. 15 is a diagram of a MOSFET reverse wave protection circuit 63 showing connection 53, line 71, connection 64 for the protect signal, and a ground terminal 75.

Figure 16:
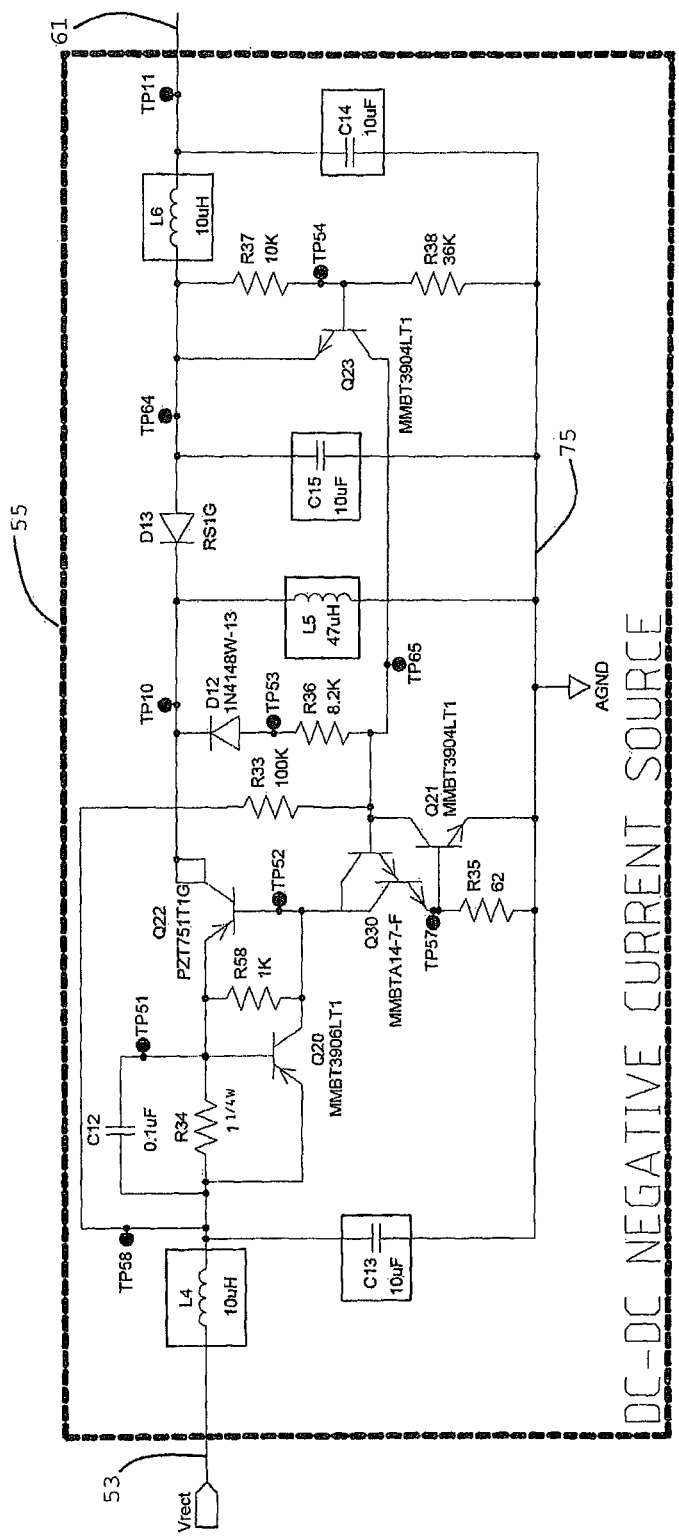
FIG. 16 is a diagram of a negative current source.
Figure 17:
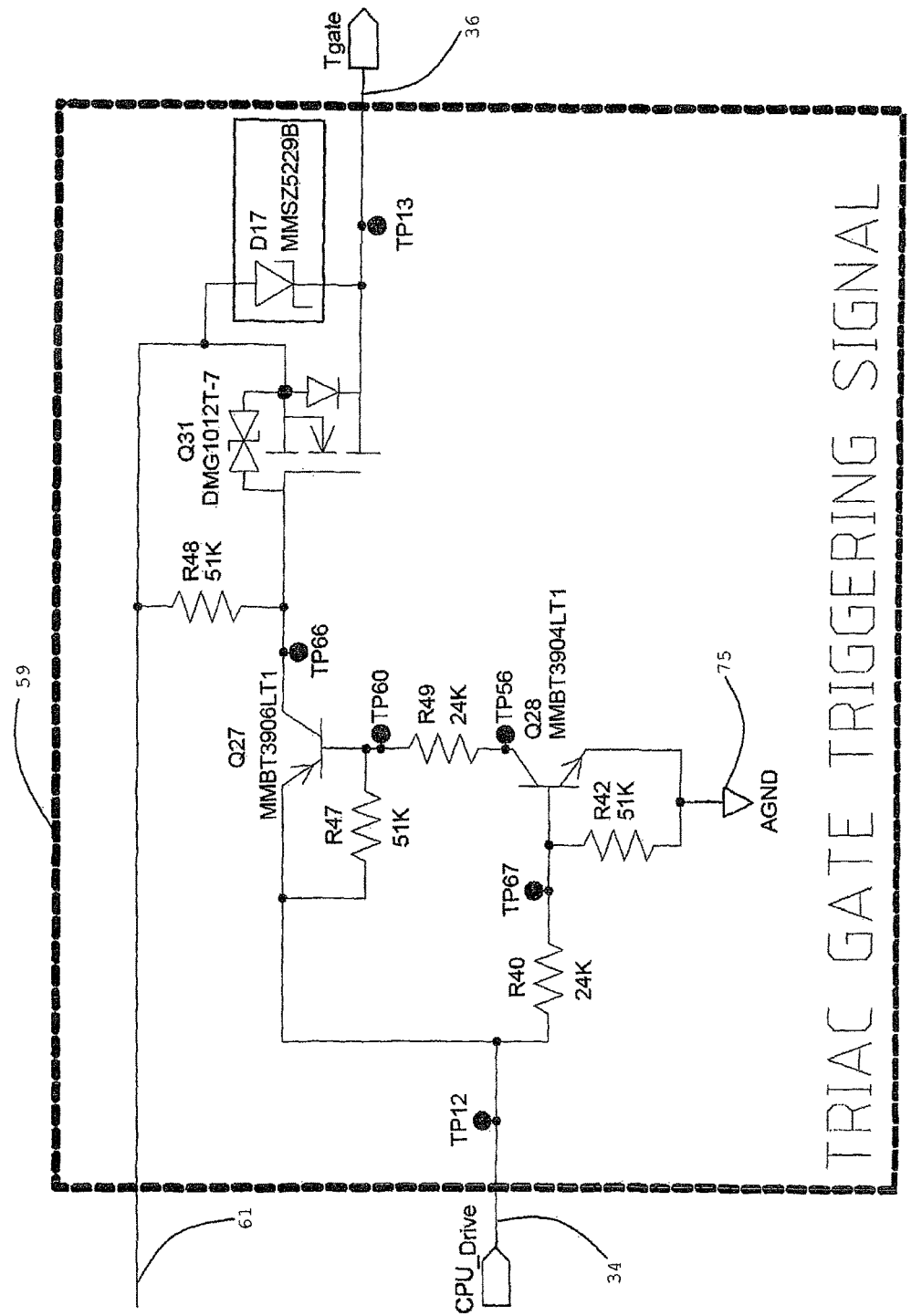
FIG. 17 is a diagram of triac gate triggering signal source.

FIG. 16 is a diagram of the DC-DC negative current source 55 having an output on connection 61, a voltage connection 53 and a ground connection 75. FIG. 17 is a diagram of triac gate triggering signal circuit 59 showing a connection 61, a drive connection 34, a triac gate signal connection 36 and a ground connection 75.

Figure 18:
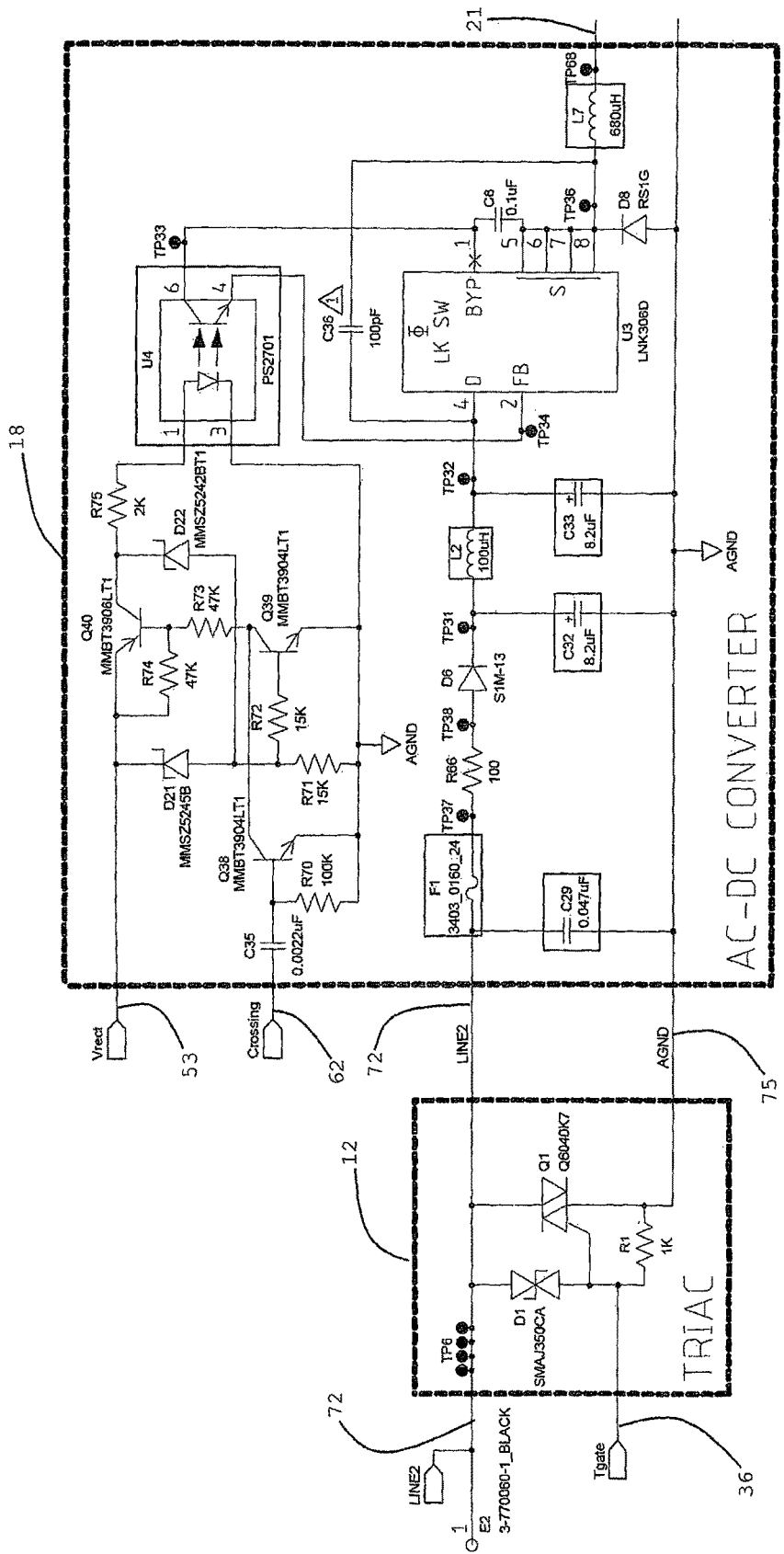
FIG. 18 is a diagram of triac and AC-DC converter.
Figure 19:
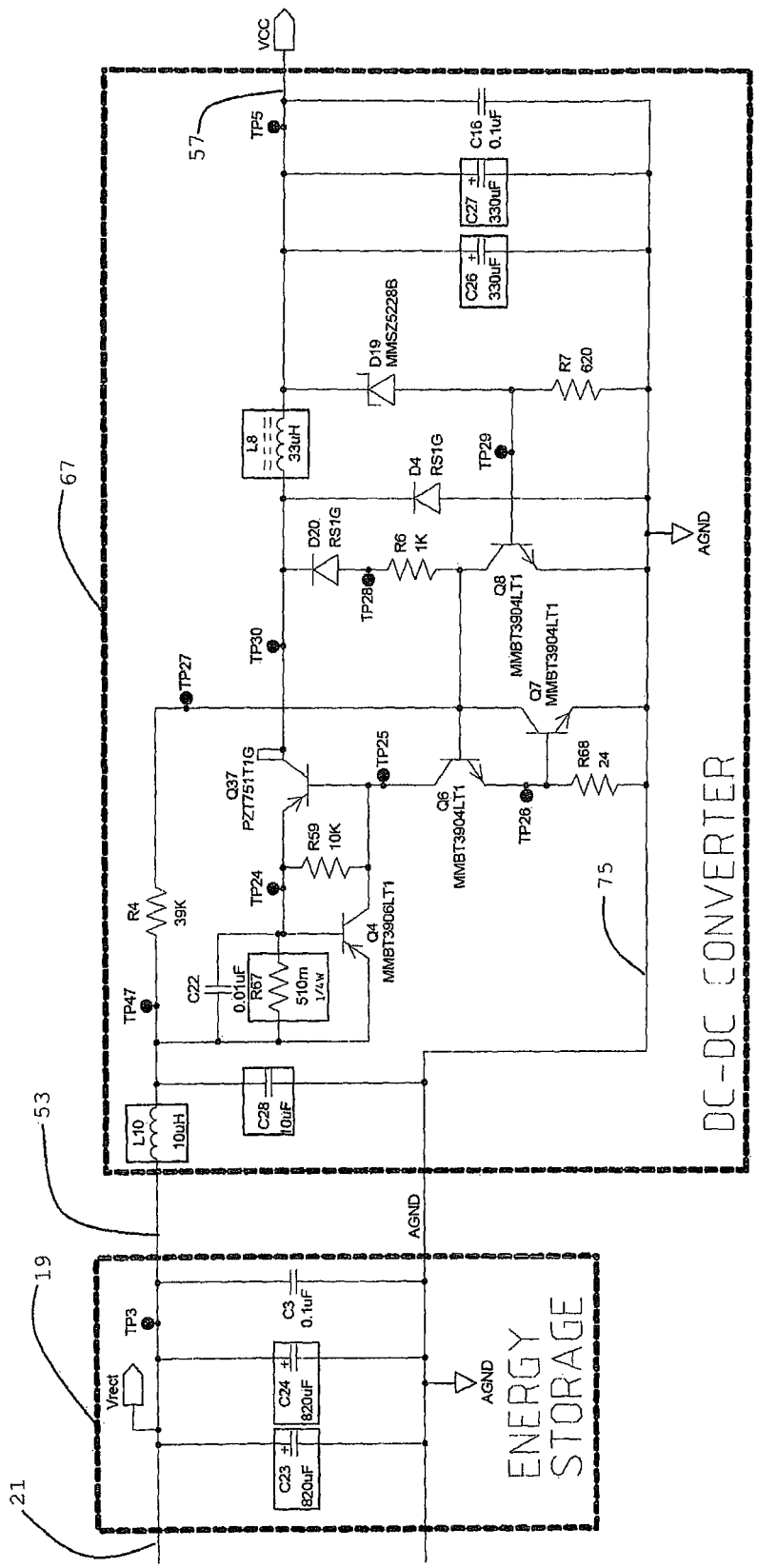
FIG. 19 is a diagram of an energy storage module and a DC-DC converter.

Power supply unit 91 of the high power version may be essentially the same as power supply unit 81 of the low power version. The following noted Figures may reveal some differences between the units. FIG. 18 is a diagram of a high power version of bypass circuit 18 having an AC-DC converter in lieu of an RC network as shown in FIG. 12. The AC-DC converter may be connected to a crossing signal on connection 62, a voltage connection 53, a line 72 connection from an output of triac 12, an energy output on connection 21 and a ground connection 75. FIG. 19 is a diagram of a DC-DC converter 67 in lieu of the linear regulator of FIG. 11. Converter 67 may have a connection 53 from the energy storage module 19, an output on connection 57 and a ground connection 75.

Figure 20:
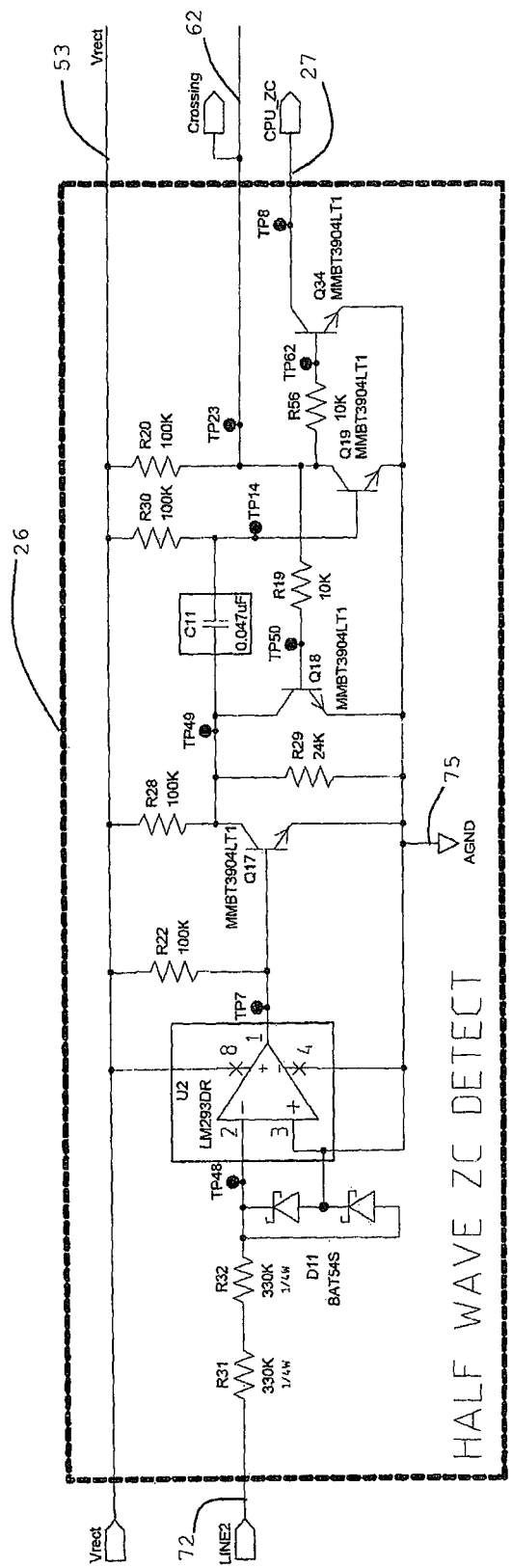
FIG. 20 is diagram of another half wave zero crossing detect circuit.

FIG. 20 is a diagram of a half wave ZC detect circuit 26 for the unit 91 high power version in lieu of circuit 26 of FIG. 13. The design of circuit 26 in FIG. 20 may be different from circuit 26 in FIG. 13 in that circuit 26 of FIG. 20 is designed to accommodate a line 72 connection. Circuit 26 may have output lines on connection 62 and 27. Circuit 26 may have a voltage connection 53 and a ground connection 75.

Figure 21:
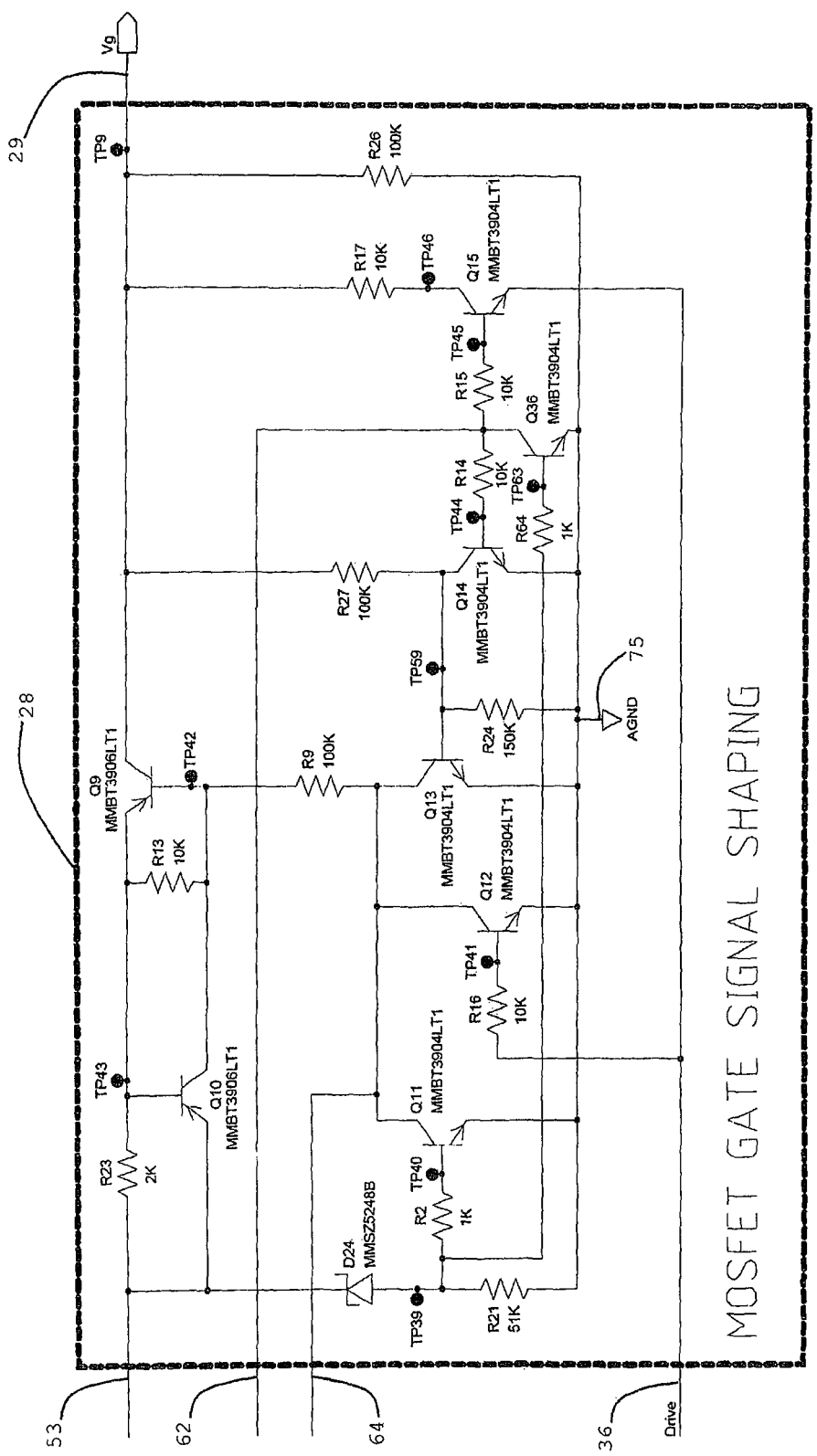
FIG. 21 is a diagram of another gate signal shaping circuit.

FIG. 21 is a diagram of gate shaping signal circuit 28 for the unit 91 high power version in lieu of circuit 28 of FIG. 14. The design of circuit 28 in FIG. 21 may be different from circuit 28 in FIG. 14 in that circuit 28 of FIG. 21 is designed to accommodate a drive signal on connection 36. Circuit 28 may also have input lines on connections 53, 62 and 64. There may also be a gate signal output on connection 29. Circuit 28 may have a ground connection 75.

A thermostat power supply may incorporate a first terminal for connection to a first line of a power source, a triac having a first input connected to the first terminal, a bypass circuit having a first input connected to the first terminal, a stealing circuit having an input connected to an output of the bypass circuit, a power steal module having an input connected to an output of the triac and an output connected to an output of the stealing circuit, a second terminal for connection to a load, a zero crossing detection module having an input connected to the first terminal, and a gate driving circuit having an input connected to an output of the zero crossing detection module, and an output connected to a second input of the power steal module.

The power steal module may be for stealing energy from the first terminal. The stealing circuit may be for storing stolen energy from the power steal module. The power steal module may incorporate one or more MOSFETs that switch on and off for stealing energy. The gate driving circuit may provide gate signals to the one or more MOSFETs for switching the one or more MOSFETs on and off.

The gate driving circuit may shape the gate signals to reduce EMI emissions from the one or more MOSFETs due to switching the one or more MOSFETs on and off. The zero crossing detection module may provide a signal to the gate driving circuit for determining times that the gate signals are to switch the one or more MOSFETs on and off relative to a zero crossing point of a waveform on the first line of the power source.

A power unit may incorporate a first terminal for connection to a power source, a triggerable switch having an input connected to the first terminal, a bypass circuit having an input connected to the first terminal, a storage having an input connected to an output of the bypass circuit, a power steal module having an input connected to an output of the triggerable switch and having an output connectable to a second terminal, a second terminal for connection to a load connected to the power source, a zero crossing detector having an input connected to the first terminal, and a gate driving circuit having an input connected to the zero crossing detector, and having an output connected to the power steal module.

The power steal module may incorporate one or more transistors that switch on and off to let current flow as deemed to the second terminal. The gate driving circuit may provide signals to the one or more transistors that switch on and off according to the signals which are adjusted in shape to result in the switch on and off of current to obtain minimized EMI emissions from switched current. The minimized EMI emissions are to comply with applicable government regulations. The one or more transistors may be MOSFETs.

The power steal module and/or gate driving circuit may further incorporate MOSFETs as the one or more transistors, one or more current limiting devices to control a rate of charge and discharge of one or more gates of the MOSFETs, and latching circuitry enabled by a voltage level detector to keep a state of the MOSFETs from a previous power steal to a subsequent power steal.

The unit may further incorporate a MOSFET wave protection module having an input connected to the first terminal and an output connected to an input of the gate signal generator. The gate signal generator may provide the signals to the one or more transistors according to timing derived from the zero crossing detector.

A thermostat power system may incorporate a first terminal for connection to a power supply and load arrangement, a second terminal for connection to the power supply and load arrangement, a triggerable switch, having an input, connected to the first terminal, a bypass circuit having an input connected to the first terminal, an energy storage module having an input connected to an output of the bypass circuit, a power steal module having an input connected to an output of the triggerable switch, and a driving circuit for a control signal having an output connected to a second input of the power steal module. The control signal may minimize EMI emissions from the power steal module.

The system may further incorporate a wave zero crossing detector having an input connected to the first terminal and an output connected to an input of the driving circuit.

The control signal from the driving circuit may goes to a gate of one or more transistors to turn on or off the one or more transistors to steal power. The turn on or off of the transistors may cause EMI emissions. The driving circuit adjusts a shape of the control signal to turn on or off the transistors in a manner to minimize EMI emissions. The one or more transistors may be MOSFETs.

The driving circuit may provide a control signal that is timed according to a signal from the wave zero crossing detector to turn on or off the transistors in a manner to minimize EMI emissions.

The triggerable switch may be selected from a group consisting of a triac, an SCR and a relay.

The system may further incorporate a reverse wave protection module having an input connected to the first terminal and an output connected to a second input of the driving circuit.

A power supply unit for a heating, ventilation and air conditioning thermostat, may incorporate a first terminal for connection to a line of a power source, a second terminal for connection to a load, a bypass circuit having an input connected to the first terminal, a triac having an input connected to the first terminal, a stealing circuit having an input connected to an output of the bypass circuit and having an output connected to the second terminal, a power steal module having an input connected to an output of the triac, and a trigger circuit having an output connected to a second input of the triac.

The unit may further incorporate a zero crossing detection circuit having an input connected to the first terminal and an output connected to an input of the trigger circuit.

The unit may further incorporate a zero crossing detection circuit having an input connected to the first terminal, and an interface circuit having an input connected to an output of the zero crossing detection circuit and having an output connected to an input of the trigger circuit.

A second output of the stealing circuit may be connected to a second input of the trigger circuit. An output of the trigger circuit may be connected to a second input of the triac. The stealing circuit may incorporate energy storage. Stored energy may go from the second output of the stealing circuit to the second input of the triac.

A zero crossing signal may go from the zero crossing detection circuit to the input of the interface circuit. A zero crossing drive signal may go from the output of the interface circuit to the input of the trigger circuit.

The zero crossing detection circuit may incorporate a half wave zero crossing detector. The trigger circuit may incorporate a DC-DC negative current source having an input connected to the second output of the stealing circuit, and a triac gate triggering signal circuit having an input connected to an output of the DC-DC negative current source.

The unit may further incorporate a DC-DC converter connected to the second output of the stealing circuit. The bypass circuit may incorporate an AC-DC converter.

The unit may further incorporate a linear regulator connected to the second output of the stealing circuit. The bypass circuit may incorporate an RC network.

A power system for thermostats, may incorporate a first terminal connected to a line of a power supply, a bypass circuit having an input connected to the first terminal, a triggerable switch having an input connected to the first terminal, a power steal module having an input connected to an output of the bypass circuit, a zero crossover detector having an input connected to an output of the bypass circuit, a energy storage module having an input connected to an output of the power steal module, and a trigger circuit having an input connected to an output of a zero crossover detector and having an output connected to a second input of the triggerable switch.

The trigger circuit may incorporate a processor. The processor may have an input connected to the output of the zero crossover detector and an output connected to the second input of the triggerable switch. The processor may determine a drive signal for the triggerable switch from a zero crossing signal of the output of the zero crossover detector and from a set of instructions.

Power may be taken from the energy storage module and used to trigger the triggerable switch near a zero crossing of energy on the line of the power supply as effected by the processor and a line pattern according to a working quadrant of the triggerable switch.

The system may further incorporate a gate signal shaper having an input connected to an output of the zero crossover detector and having an output connected to the power steal module. The power steal module may incorporate one or more MOSFETs.

An output of the gate signal shaper may be a gate signal having a shape that switches the one or more MOSFETs on or off in a manner to minimize EMI emissions from switching stolen power by the one or more MOSFETs.

The system may further incorporate a MOSFET reverse wave protection circuit having an input connected to the first terminal and an output connected to a second input of the gate signal shaper.

The power steal module may steal power from the first terminal or an output of the bypass circuit. The power steal module may provide stolen power to the energy storage module.

A thermostat power system may incorporate a triggerable switch having an input connected to a first terminal, a bypass circuit having an input connected to the first terminal, an energy storage module having an input connected to an output of the bypass circuit and an output connected to a second terminal, a power steal circuit having an input connected to an output of the triggerable switch, and an active trigger module having an input connected to an output of a wave position detector, having an output connected to the triggerable switch, and having an input connected to a second output of the energy storage module. The first terminal and second terminal may be for connection to an AC power line and load arrangement.

The power steal circuit may incorporate transistors. A trig signal may be sent at certain times, according to information at the output of the wave position detector, from the output of the active trigger module to a second input of the triggerable switch. A signal from the output of the triggerable switch to the input of the power steal circuit may turn the transistors on or off. The active trigger module may take energy at the second input from the second output of the energy storage to trigger the triggerable switch near a zero crossing of the power line when energy directly from the power line is insufficient to trigger the triggerable switch.

A power supply unit for a heat, ventilation and air conditioning thermostat, may incorporate a triac having an input, a gate and an output, a bypass circuit having an input connected to the input of the triac, a stealing circuit having an input connected to an output of the bypass circuit, and a MOSFET power steal module having an input connected to the output of the triac. The input of the triac and an output of the MOSFET power steal module may be primary terminals for connection in a power circuit.

The power circuit may incorporate a power source connected in series with an electrical load. The electrical load may be an electric heating mechanism.

The stealing circuit may incorporate an energy storage module. The MOSFET power steal module may steal energy and the energy may go to the energy storage module. The energy may be used to trigger the triac at a zero crossing of line voltage from the power source.

The unit may further incorporate a gate signal shaper connected to the MOSFET power steal module. The gate signal shaper may provide a gate signal that results in a soft transition of turning on and off of the MOSFETs.

The unit may further incorporate a half wave zero cross detect module connected to the line voltage, to a gate signal shaper, and to a triac gate triggering module.

Power supply electronics for a thermostat, may incorporate a first terminal for connection to a first line of a power source, a bypass circuit having an input connected to the first terminal, a triac having an input connected to the first terminal, a second terminal for connection to a load, a stealing circuit having an input connected to an output of the bypass circuit and an output connected to the second terminal, and a power steal module having an input connected to the output of the triac and an output connected to the second terminal.

The power steal module may incorporate one or more MOSFETs that are switched on to steal power. The stealing circuit may incorporate an energy storage unit. Stolen power goes to the energy storage unit.

The bypass circuit may incorporate an RC network, or an AC-DC converter.

The electronics may further incorporate a linear regulator and a super capacitor connected to an output of the energy storage unit.

The electronics may further incorporate a DC-DC converter connected to an output of the energy storage unit.

If the power steal module incorporates two or more MOSFETs, then a serial MOSFETs power stealing approach may be effected.

A thermostatic power supply may incorporate a bypass circuit, a first terminal for connection to a power source, a second terminal for connection to a load, a bypass circuit having an input connected to the first terminal, an energy storage module having an input connected to the bypass circuit and an output connected to the second terminal, a triggerable switch having an input connected to the first terminal, and a power steal module having an input connected to an output of the triggerable switch and an output connected to the second terminal.

The supply may further incorporate a DC-DC converter having an input connected to the output of the energy storage module. The bypass circuit may incorporate an AC-DC converter.

The supply may further incorporate a linear regulator having an input connected to the output of the energy storage module. The bypass circuit may incorporate an RC network.

The supply may further incorporate a super capacitor connected to the linear regulator. The triggerable switch may be selected from a group consisting of a triac, SCR and a relay. The power steal module may incorporate one or more switching MOSFETs.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A power supply unit for a heating, ventilation and air conditioning thermostat, comprising:
   a first terminal for connection to a line of a power source;
   a second terminal for connection to a load;
   a bypass circuit having an input connected to the first terminal;
   a triac having an input connected to the first terminal;
   a stealing circuit having an input connected to an output of the bypass circuit and having an output connected to the second terminal;
   a power steal module having an input connected to an output of the triac; and
   a drive circuit having an output connected to a second input of the power steal module.

2. The unit of claim 1, further comprising a zero crossing detection circuit having an input connected to the first terminal and an output connected to an input of the drive circuit.

3. The unit of claim 1, further comprising:
   a zero crossing detection circuit having an input connected to the first terminal; and
   the zero crossing detection circuit having an output connected to a central processing unit (CPU).

4. The unit of claim 1, wherein a second output of the stealing circuit is connected to a second input of the drive circuit.

5. The unit of claim 4, wherein:
the stealing circuit comprises an energy storage; and
stored energy goes from the second output of the stealing circuit to the second input of the drive circuit.

6. The unit of claim 5, wherein the energy storage is always active.

7. The unit of claim 1, further comprising a trigger circuit having an output connected to an input of the drive circuit.

8. The unit of claim 1, further comprising:
a zero crossing detection circuit having a half wave zero crossing detector; and
a trigger circuit comprising:
  a DC-DC negative current source having an input connected to a second output of the stealing circuit; and
  a triac gate triggering signal circuit having an input connected to an output of the DC-DC negative current source.

9. The unit of claim 1, further comprising:
a DC-DC converter connected to the output of the stealing circuit; and
wherein the bypass circuit comprises an AC-DC converter.

10. A power system for thermostats, comprising:
a first terminal configured to be connected to a line of a power supply;
a bypass circuit having an input connected to the first terminal;
a triggerable switch having an input connected to the first terminal;
a power steal module having a first input connected to an output of the bypass circuit and a second input connected to the first terminal, the power steal module is configured to steal power from the bypass circuit or the first terminal;
an energy storage module having an input connected to an output of the power steal module for receiving stolen power from the power steal module; and
a processor having an input connected to an output of the energy storage module and having an output connected to a second input of the triggerable switch.

11. The system of claim 10, wherein the power steal module is configured to be active when a thermostat is in an on state and when the thermostat is in an off state.

12. The system of claim 10, wherein the power steal module is configured to be active when a thermostat is in an on state and inactive when the thermostat is in an off state.

13. The system of claim 10, further comprising:
a zero crossover detector having an input connected to an output of the bypass circuit and an output connected to an input of the processor; and
wherein the processor determines a drive signal for the triggerable switch from a zero crossing signal of the output of the zero crossover detector and from a set of instructions.

14. The system of claim 13, wherein power is taken from the energy storage module and used to trigger the triggerable switch near a zero crossing of energy on the line of the power supply as effected by the processor and a line pattern according to a working quadrant of the triggerable switch.

15. The system of claim 13, further comprising:
a gate signal shaper having an input connected to an output of the zero crossover detector and having an output connected to the power steal module; and
wherein the power steal module comprises one or more MOSFETs.

16. The system of claim 15, wherein an output of the gate signal shaper is a gate signal having a shape that switches the one or more MOSFETs on or off in a manner to minimize EMI emissions from switching stolen power by the one or more MOSFETs.

17. The system of claim 15, further comprising a MOSFET reverse wave protection circuit having an input connected to the first terminal and an output connected to a second input of the gate signal shaper.

18. A thermostat power system comprising:
a triggerable switch having an input connected to a first terminal;
a bypass circuit having an input connected to the first terminal;
an energy storage module having an input connected to an output of the bypass circuit and an output connected to a second terminal;
a power steal circuit having an input connected to an output of the triggerable switch; and
an active trigger module having an output connected to the triggerable switch and an input connected to a second output of the energy storage module for taking energy from the energy storage module to trigger the triggerable switch.

19. The system of claim 18, wherein the first terminal and second terminal are for connection to an AC power line and load arrangement.

20. The system of claim 18, further comprising:
a wave position detector having an output connected to a second input of the active trigger module; and
wherein:
a trigger signal is sent at certain times, according to information at the output of the wave position detector, from the output of the active trigger module to a second input of the triggerable switch;
a signal from the output of the triggerable switch to the input of the power steal circuit turns the power steal circuit on or off; and
the active trigger module takes energy at a second input from the second output of the energy storage module to trigger the triggerable switch near a zero crossing of a power line in communication with the first terminal and the second terminal when energy directly from the power line is insufficient to trigger the triggerable switch.

* * * * *